(12) United States Patent
Nidhi et al.

(10) Patent No.: US 11,715,790 B2
(45) Date of Patent: Aug. 1, 2023

(54) CHARGE-INDUCED THRESHOLD VOLTAGE TUNING IN III-N TRANSISTORS

(71) Applicant: Intel Corporation, Santa Clara, CA (US)

(72) Inventors: Nidhi Nidhi, Hillsboro, OR (US); Marko Radosavljevic, Portland, OR (US); Sansaptak Dasgupta, Hillsboro, OR (US); Yang Cao, Beaverton, OR (US); Han Wui Then, Portland, OR (US); Johann Christian Rode, Hillsboro, OR (US); Rahul Ramaswamy, Portland, OR (US); Walid M. Hafez, Portland, OR (US); Paul B. Fischer, Portland, OR (US)

(73) Assignee: Intel Corporation, Santa Clara, CA (US)

(*) Notice: Subject to any disclaimer, the term of this patent is extended or adjusted under 35 U.S.C. 154(b) by 889 days.

(21) Appl. No.: 16/390,819

(22) Filed: Apr. 22, 2019

(65) Prior Publication Data

US 2020/0335590 A1    Oct. 22, 2020

(51) Int. Cl.
*H01L 29/778* (2006.01)
*H01L 29/20* (2006.01)
(Continued)

(52) U.S. Cl.
CPC ...... *H01L 29/7786* (2013.01); *H01L 21/0254* (2013.01); *H01L 21/02458* (2013.01);
(Continued)

(58) Field of Classification Search
CPC .......... H01L 21/02458; H01L 21/0254; H01L 21/0257; H01L 21/02576; H01L 21/02579;
(Continued)

(56) References Cited

U.S. PATENT DOCUMENTS

2017/0345921 A1* 11/2017 Feng ................... H01L 29/4236
2019/0207021 A1*  7/2019 Chu .................. H01L 29/42316
(Continued)

OTHER PUBLICATIONS

Huang, AnPing, et al., "Interface Dipole Engineering in Metal Gate/High-K Stacks," Chinese Science Bulletin, Aug. 2012, vol. 57, No. 22:2872-2878; 8 pages.
(Continued)

*Primary Examiner* — Cheung Lee
(74) *Attorney, Agent, or Firm* — Akona IP

(57) ABSTRACT

Disclosed herein are IC structures, packages, and devices that include III-N transistors implementing various means by which their threshold voltage it tuned. In some embodiments, a III-N transistor may include a doped semiconductor material or a fixed charge material included in a gate stack of the transistor. In other embodiments, a III-N transistor may include a doped semiconductor material or a fixed charge material included between a gate stack and a III-N channel stack of the transistor. Including doped semiconductor or fixed charge materials either in the gate stack or between the gate stack and the III-N channel stack of III-N transistors adds charges, which affects the amount of 2DEG and, therefore, affects the threshold voltages of these transistors.

19 Claims, 9 Drawing Sheets

(51) Int. Cl.
*H01L 29/66* (2006.01)
*H01L 29/205* (2006.01)
*H01L 29/49* (2006.01)
*H01L 29/45* (2006.01)
*H01L 21/02* (2006.01)
*H01L 29/808* (2006.01)
*H01L 29/10* (2006.01)

(52) U.S. Cl.
CPC ........ *H01L 29/2003* (2013.01); *H01L 29/205* (2013.01); *H01L 29/452* (2013.01); *H01L 29/49* (2013.01); *H01L 29/4925* (2013.01); *H01L 29/66462* (2013.01); *H01L 29/7781* (2013.01); *H01L 29/808* (2013.01); *H01L 29/1066* (2013.01)

(58) Field of Classification Search
CPC ............. H01L 29/1066; H01L 29/2003; H01L 29/205; H01L 29/4925; H01L 29/66462; H01L 29/778; H01L 29/7781; H01L 29/7783; H01L 29/7786; H01L 29/80; H01L 29/802; H01L 29/808
See application file for complete search history.

(56) References Cited

U.S. PATENT DOCUMENTS

2020/0105916 A1* 4/2020 Moens ................ H01L 29/7785
2020/0335616 A1* 10/2020 Chen ................ H01L 29/66462

OTHER PUBLICATIONS

Kirsch, P.D., et al., "Dipole Model Explaining High-K/Metal Gate Field Effect Transistor Threshold Voltage Tuning," Applied Physics Letters 92, 092901 (published Mar. 4, 2008); 4 pages.

* cited by examiner

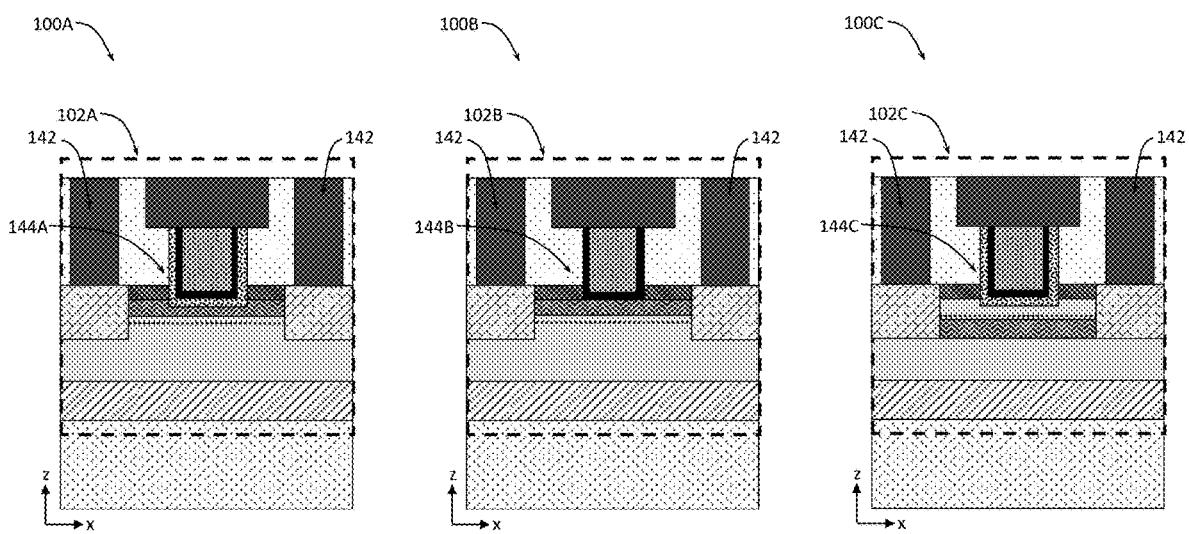
FIG. 1A  FIG. 1B  FIG. 1C

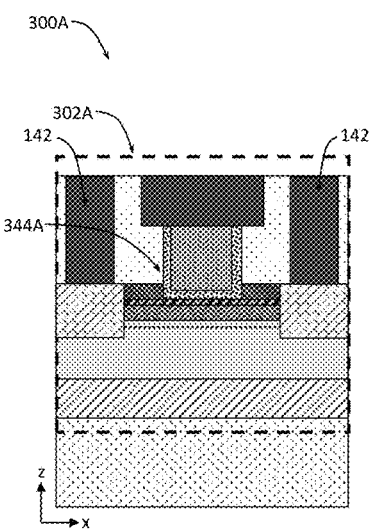 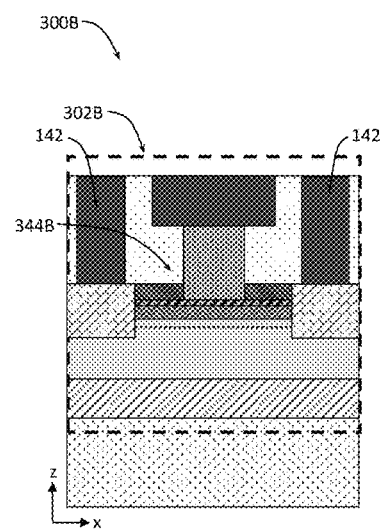 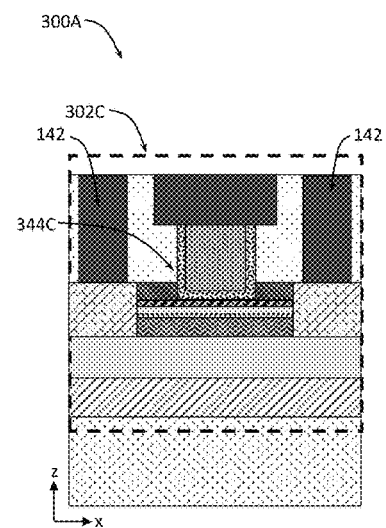
FIG. 3A     FIG. 3B     FIG. 3C

CHARGE-INDUCED THRESHOLD VOLTAGE TUNING IN III-N TRANSISTORS

BACKGROUND

Solid-state devices that can be used in high-frequency and/or high voltage applications are of great importance in modern semiconductor technologies. For example, radio frequency (RF) integrated circuits (ICs) (RFICs) and power management integrated circuits (PMICs) may be critical functional blocks in system on a chip (SoC) implementations. Such SoC implementations may be found in mobile computing platforms such as smartphones, tablets, laptops, netbooks, and the like. In such implementations, the RFICs and PMICs are important factors for power efficiency and form factor, and can be equally or even more important than logic and memory circuits.

Transistor technologies based on semiconductor materials other than silicon (Si), may be particularly advantageous for high-frequency and high voltage applications. For example, III-N material based transistors such as gallium nitride (GaN) transistors are being extensively evaluated as an alternative to Si-based transistors due, in part, to the large band gap and high mobility of some III-N materials.

Despite the advantages, there are some challenges associated with III-N transistors that may hinder their large-scale implementation. One such challenge resides in controlling (e.g., fine-tuning) their threshold voltage (e.g., the minimum gate-to-source voltage, VGS, that is needed to create a conducting path between the source and drain terminals of a transistor). Currently this challenge is much more difficult for III-N transistors than for conventional Si-based transistors because most III-N material surfaces suffer from Fermi-level pinning, which makes it almost impossible to move the threshold voltage of a III-N transistor by carefully selecting a gate electrode material (e.g., metal) with a suitable workfunction.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 1A-1C provide cross-sectional side views illustrating different IC structures that include a III-N transistor with a doped semiconductor material included in a gate stack to tune the threshold voltage of the transistor, according to some embodiments of the present disclosure.

FIGS. 3A-3C provide cross-sectional side views illustrating different IC structures that include a III-N transistor with a doped semiconductor material included between a gate stack and a III-N channel stack to tune the threshold voltage of the transistor, according to some embodiments of the present disclosure.

DETAILED DESCRIPTION

Overview

Figures 2A, 2B, 2C:
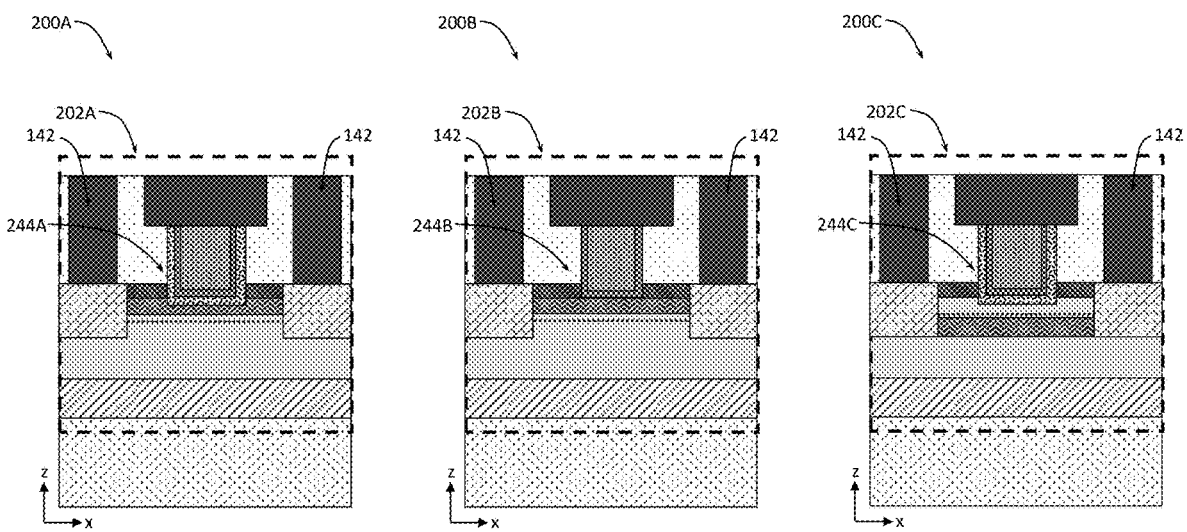
FIGS. 2A-2C provide cross-sectional side views illustrating different IC structures that include a III-N transistor with a fixed charge material included in a gate stack to tune the threshold voltage of the transistor, according to some embodiments of the present disclosure.

As described above, transistors based on III-N semiconductor materials (i.e., III-N transistors) have properties that make them particularly advantageous for certain applications. For example, because GaN has a larger band gap (about 3.4 electron-volts (eV)) than Si (band gap of about 1.1 eV), a GaN transistor is expected to withstand a larger electric field (resulting, e.g., from applying a large voltage to the drain, Vdd) before suffering breakdown, compared to a Si transistor of similar dimensions. Furthermore, III-N transistors may advantageously employ a 2D electron gas (2DEG) (i.e., a group of electrons, an electron gas, free to move in two dimensions but tightly confined in the third dimension, e.g., a 2D sheet charge) as its transport channel, enabling high mobility without relying on using impurity dopants. For example, the 2DEG may be formed in a portion of a III-N semiconductor material that is near a heterojunction interface formed between the III-N semiconductor material and a charge-inducing film of a material having larger spontaneous and piezoelectric polarization, compared to the III-N semiconductor material. Such a film is generally referred to as a "polarization material" while the III-N semiconductor material adjacent to the polarization material may be referred to as a "III-N channel material" because this is where a conductive channel (2DEG) may be formed during operation of the III-N transistor. Together, a stack of a III-N channel material and a polarization material may be referred to as a "III-N channel stack" of a III-N transistor. A material that has a lattice constant smaller than that of a given III-N channel material may serve as a polarization material that causes formation of 2DEG in the III-N channel material. Namely, the lattice mismatch between these two materials may induce tensile strain in the polarization material, which may allow forming high charge densities (e.g., 2DEG) in a portion of the III-N channel material adjacent to the polarization material. For example, providing a polarization material such as AlGaN to be adjacent to (e.g., in contact with) a III-N channel material such as GaN may induce tensile strain in the polarization material due to the lattice constant of a polarization material such as AlGaN being smaller than that of a III-N channel material such as GaN, which allows forming very high charge densities in the III-N channel material without intentionally adding impurity dopants to the III-N channel material. As a result, high mobility of charge carriers in the III-N channel material may, advantageously, be realized.

Also as described above, despite the advantages, there are some challenges associated with III-N transistors that may hinder their large-scale implementation, such as difficulties in controlling threshold voltages of III-N transistors. Conventional solutions for controlling the threshold voltage of a III-N transistor include etching of a polarization layer to create a recess in which a gate stack for a III-N transistor is to be provided. However, such solutions do not always provide sufficient level of control of the resulting threshold voltage because nanometer-level control of the etching process is very difficult, especially when carried out on multiple transistors across a wafer. In addition, using the polarization layer thickness to target the threshold voltage may lead to unfavorable power, performance, and reliability tradeoffs. For example, a relatively thin polarization layer may be used to realize an enhancement mode III-N transistor (i.e., a transistor for which the threshold voltage is above 0 volts), but such a thin polarization layer may lead to higher gate leakage, poor mobility, and other negative reliability effects. On the other hand, a thicker polarization layer may be used to realize a depletion mode III-N transistor (i.e., a transistor for which the threshold voltage is below 0 volts), but such a thicker polarization layer may degrade short channel effects and overall performance of the transistor due to thicker effective oxide thickness.

Disclosed herein are IC structures, packages, and device assemblies that include III-N transistors implementing various means by which their threshold voltage it tuned. In some embodiments, a III-N transistor may include a doped semiconductor material or a fixed charge material included in a gate stack of the transistor. In other embodiments, a III-N transistor may include a doped semiconductor material or a fixed charge material included between a gate stack and a III-N channel stack of the transistor. Including doped semiconductor or fixed charge materials either in the gate stack or between the gate stack and the III-N channel stack of III-N transistors adds charges (either positive or negative) which would not otherwise be there, which affects the amount of 2DEG and, therefore, affects the threshold voltages of these transistors. Addition of doped semiconductor layers may also create an additional electric field in the region, which may enable the device to deplete or add electrons to the 2DEG channel and, hence, change the threshold voltage of the device. Any of such doped semiconductor or fixed charge materials included either in the gate stack or between the gate stack and the III-N channel stack of a III-N transistor may be referred to herein as a "charge-induced threshold voltage tuning element" because each of them is adds charges which provide means for tuning the threshold voltage of a III-N transistor. In some embodiments, any of the charge-induced threshold voltage tuning elements described herein may be used in combination with one another and/or in combination with more conventional means for controlling threshold voltage, such as by controlling polarization material thickness as described above. Providing III-N transistors with charge-induced threshold voltage tuning elements as described herein may enables easier and more accurate control of threshold voltage compared to that provided only by relying on polarization material recess. Moreover, it may provide a feasible approach for realizing enhancement mode III-N transistors (traditionally, III-N transistors have been implemented only as depletion mode transistors), and enable fabrication of both depletion and enhancement mode transistors on a single wafer. Providing III-N transistors with charge-induced threshold voltage tuning elements as described herein may be particularly advantageous for a millimeter-wave wireless technology such as fifth generation (5G) wireless technology.

As used herein, the term "III-N semiconductor material" (or, simply, "III-N material") refers to a compound semiconductor material with a first sub-lattice of at least one element from group III of the periodic table (e.g., Al, Ga, In) and a second sub-lattice of nitrogen (N). As used herein, the term "III-N transistor" refers to a field-effect transistor (FET) that includes a III-N material (which may include one or more different III-N materials, e.g., a plurality of different III-N materials stacked over one another) as an active material (i.e., the material in which a conducting channel of the transistor forms during operation, in which context the III-N material is also referred to as a "III-N channel material").

While discussions provided herein refer to the two-dimensional charge carrier layers as "2DEG" layers, embodiments described herein are also applicable to systems and material combinations in which 2D hole gas (2DHG) may be formed, instead of 2DEG. Thus, unless stated otherwise, explanations of embodiments referring to 2DEG may be applied to transistors implementing 2DHG instead, all of such embodiments being within the scope of the present disclosure.

Each of the structures, packages, methods, devices, and systems of the present disclosure may have several innovative aspects, no single one of which being solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc. Similarly, the terms naming various compounds refer to materials having any combination of the individual elements within a compound (e.g., "gallium nitride" or "GaN" refers to a material that includes gallium and nitrogen, "aluminum indium gallium nitride" or "AlInGaN" refers to a material that includes aluminum, indium, gallium and nitrogen, and so on). Further, the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 5A-5B, such a collection may be referred to herein without the letters, e.g., as "FIG. 5." In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

In the drawings, some schematic illustrations of example structures of various structures, devices, and assemblies described herein may be shown with precise right angles and straight lines, but it is to be understood that such schematic illustrations may not reflect real-life process limitations that may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC structures that include at least one III-N transistor with at least one charge-induced threshold voltage tuning element as described herein may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on an IC, provided as an integral part of an IC, or those connected to an IC. The IC may be either analog or digital and may be used in a number of applications, such as microprocessors, optoelectronics, logic blocks, audio amplifiers, etc., depending on the components associated with the IC. In some embodiments, IC structures as described herein may be included in a RFIC, which may, e.g., be included in any component associated with an IC of an RF receiver, an RF transmitter, or an RF transceiver, e.g., as used in telecommunications within base stations (BS) or user equipment (UE). Such components may include, but are not limited to, power amplifiers, low-noise amplifiers, RF filters (including arrays of RF filters, or RF filter banks), RF switches (i.e., devices to route high-frequency signals through transmission paths), upconverters, downconverters, and duplexers. In some embodiments, the IC structures as described herein may be employed as part of a chipset for executing one or more related functions in a computer.

III-N Transistors with Doped Semiconductor Materials Included in Gate Stacks

FIGS. 1A-1C provide cross-sectional side views illustrating different examples of IC structures 100A, 100B, and 100C, respectively (collectively referred to as "IC structures 100"), each of which includes a III-N transistor with a doped semiconductor material included in a gate stack to tune the threshold voltage of the transistor, according to some embodiments of the present disclosure. Each of FIGS. 1A-1C provides a cross-sectional side view (a view in an x-z plane of an example x-y-z coordinate system) illustrating an IC structure 100 with a III-N transistor 102 (labeled in FIGS. 1A-1C as transistors 102A, 102B, and 102C, respectively), an approximate boundary of which is illustrated in each of FIGS. 1A-1C with a thick dashed line. In particular, FIG. 1A illustrates an embodiment where a gate stack of a III-N transistor includes a gate dielectric material and where a polarization material is included between the gate stack and a III-N channel material, FIG. 1B illustrates an embodiment where a gate stack of a III-N transistor does not include a gate dielectric material and where a polarization material is included between the gate stack and a III-N channel material, and FIG. 1C illustrates an embodiment where a gate stack of a III-N transistor includes a gate dielectric material and where a III-N channel material is included between the gate stack and a polarization material.

A legend provided within a dashed box at the bottom of FIGS. 1A-1C illustrates colors/patterns used to indicate some classes of materials of some of the elements shown in FIGS. 1A-1C, so that FIGS. 1A-1C are not cluttered by too many reference numerals. For example, FIGS. 1A-1C use different colors/patterns to identify a support structure 108, an insulator 110, a III-N channel material 112, a polarization material 114, source/drain (S/D) regions 116 of the III-N transistor 102, an electrically conductive material 118 used to implement contacts to various terminals of the III-N transistor 102, a gate dielectric material 120, a gate electrode material 122, a buffer material 124, a hard-mask material 126, and a doped semiconductor material 130 used to tune the threshold voltage of the III-N transistor 102.

The support structure 108 may be any suitable structure, e.g., a substrate, a die, or a chip, on which at least one III-N transistor with at least one charge-induced threshold voltage tuning element as described herein may be implemented. In some embodiments, the support structure 108 may include a semiconductor, such as silicon. In other implementations, the support structure 108 may include/be alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N or group IV materials.

In some embodiments, the support structure 108 may include a ceramic material, or any other non-semiconductor material. For example, in some embodiments, the support structure 108 may include glass, a combination of organic and inorganic materials, embedded portions having different materials, etc. Although a few examples of materials from which the support structure 108 may be formed are described here, any material that may serve as a foundation upon which at least one III-N transistor with at least one charge-induced threshold voltage tuning element as described herein may be built falls within the spirit and scope of the present disclosure.

Although not specifically shown in FIG. 1, in some embodiments, the support structure 108 of the IC structure 100 may include an insulating layer, such as an oxide isolation layer, provided thereon. For example, in some embodiments, a layer of the insulator 110 may be provided over the support structure 108 (not shown in FIG. 1). The insulator 110 may include any suitable insulating material, e.g., any suitable interlayer dielectric (ILD), to electrically isolate the semiconductor material of the support structure 108 from other regions of or surrounding the III-N transistor 102. Providing such an insulating layer over the support structure 108 may help mitigate the likelihood that conductive pathways will form through the support structure 108 (e.g., a conductive pathway between the S/D regions 116). Examples of the insulator 110 may include, in some embodiments, silicon oxide, silicon nitride, aluminum oxide, and/or silicon oxynitride. In general, the insulator 110 may be provided in various portions of the IC structure 100. In some embodiments, the insulator 110 may include a continuous insulator material encompassing at least portions of the III-N transistor 102. In various embodiments, the insulator 110 may include different insulating materials in different portions of the IC structure 100.

In some embodiments, the III-N channel material 112 may be formed of a compound semiconductor with a first sub-lattice of at least one element from group III of the periodic table (e.g., Al, Ga, In), and a second sub-lattice of nitrogen (N). In some embodiments, the III-N channel material 112 may be a binary, ternary, or quaternary III-N compound semiconductor that is an alloy of two, three, or even four elements from group III of the periodic table (e.g., boron, aluminum, indium, gallium) and nitrogen.

In general, the III-N channel material 112 may be composed of various III-N semiconductor material systems including, for example, N-type or P-type III-N materials systems, depending on whether the III-N transistor 102 is an N-type or a P-type transistor. For some N-type transistor embodiments, the III-N channel material 112 may advantageously be a III-N material having a high electron mobility, such as, but not limited to GaN. In some such embodiments, the III-N channel material 112 may be a ternary III-N alloy, such as InGaN, or a quaternary III-N alloy, such as AlInGaN.

In some embodiments, the III-N channel material 112 may be formed of a highly crystalline semiconductor, e.g., of substantially a monocrystalline semiconductor (possibly with some limited amount of defects, e.g., dislocations). The quality of the III-N channel material 112 (e.g., in terms of defects or crystallinity) may be higher than that of other III-N materials of, or near, the III-N transistor 102 since, during the operation of the III-N transistor 102, a transistor channel will form in the III-N channel material 112. A portion of the III-N channel material 112 where a transistor channel of the III-N transistor 102 forms during operation may be referred to as a "III-N channel material/region" of the III-N transistor 102.

In some embodiments, the III-N channel material 112 may be an intrinsic III-N semiconductor material or alloy, not intentionally doped with any electrically active impurity. In alternate embodiments, one or more a nominal impurity dopant level may be present within the III-N channel material 112, for example to set a threshold voltage (Vt) of the III-N transistor 102, or to provide halo pocket implants, etc. In such impurity-doped embodiments however, impurity dopant level within the III-N channel material 112 may be relatively low, for example below $10^{15}$ dopant atoms per cubic centimeter (#/$cm^3$ or, simply, $cm^{-3}$), or below $10^{13}$ $cm^{-3}$.

In various embodiments, a thickness of the III-N channel material 112 may be between about 5 and 2000 nanometers, including all values and ranges therein, e.g., between about 50 and 1000 nanometers, or between about 10 and 50 nanometers. Unless specified otherwise, all thicknesses described herein refer to a dimension measured in a direction perpendicular to the support structure 108.

Turning now to the polarization material 114 of the III-N transistor 102, in general, the polarization material 114 may be a layer of a charge-inducing film of a material having larger spontaneous and/or piezoelectric polarization than that of the bulk of the III-N layer material immediately below it (e.g., the III-N channel material 112), creating a heterojunction (i.e., an interface that occurs between two layers or regions of semiconductors having unequal band gaps) with the III-N channel material 112, and leading to formation of 2DEG at or near (e.g., immediately below) that interface, during operation of the III-N transistor 102. As described above, a 2DEG layer may be formed during operation of a III-N transistor in a layer of a III-N semiconductor material immediately below a suitable polarization layer. In various embodiments, the polarization material 114 may include materials such as AlN, InAlN, AlGaN, or $Al_xIn_yGa_{1-x-y}N$, and may have a thickness between about 1 and 50 nanometers, including all values and ranges therein, e.g., between about 5 and 15 nanometers or between about 10 and 30 nanometers. In some embodiments, the polarization material 114 may include any suitable semiconductor material having a lattice constant smaller than that of the III-N channel material 112.

As also shown in FIG. 1, the III-N transistor 102 may include two S/D regions 116, where one of the S/D regions 116 is a source region and another one is a drain region, where the "source" and the "drain" designations may be interchangeable. As is well-known, in a transistor, S/D regions (also sometimes interchangeably referred to as "diffusion regions") are regions that can supply charge carriers for the transistor channel (e.g., the transistor channel in the III-N channel material 112) of the transistor (e.g., the III-N transistor 102). In some embodiments, the S/D regions 116 may include doped semiconductor materials, such as doped InGaN. Often, the S/D regions may be highly doped, e.g., with dopant concentrations of at least above $1 \times 10^{21}$ cm$^{-3}$, in order to advantageously form Ohmic contacts with the respective S/D electrodes of the III-N transistor 102 (e.g., electrodes 142 shown in FIG. 1, made of the electrically conductive material 118), although these regions may also have lower dopant concentrations in some implementations. Regardless of the exact doping levels, the S/D regions 116 are the regions having dopant concentration higher than in other regions between the source region (e.g., the S/D region 116 shown on the left side in FIG. 1) and the drain region (e.g., the S/D region 116 shown on the right side in FIG. 1), i.e., higher than the III-N channel material 112. For that reason, sometimes the S/D regions are referred to as highly doped (HD) S/D regions. In further embodiments, one or more layers of metal and/or metal alloys may be used to form the S/D regions 116.

The electrically conductive material 118 of the S/D electrodes 142 may include any suitable electrically conductive material, alloy, or a stack of multiple electrically conductive materials. In some embodiments, the electrically conductive material 118 may include one or more metals or metal alloys, with metals such as copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these. In some embodiments, the electrically conductive material 118 may include one or more electrically conductive alloys, oxides, or carbides of one or more metals. In some embodiments, the electrically conductive material 118 may include a doped semiconductor, such as silicon or another semiconductor doped with an N-type dopant or a P-type dopant. Metals may provide higher conductivity, while doped semiconductors may be easier to pattern during fabrication. In some embodiments, the S/D electrodes 142 may have a thickness between about 2 nanometers and 1000 nanometers, preferably between about 2 nanometers and 100 nanometers. FIG. 1 further illustrates that the electrically conductive material 118 may also be used to form electrical contact to the gate electrode of the III-N transistor 102 (i.e., in general, the electrically conductive material 118 may also be used to form electrical contacts to any of the transistor terminals of the III-N transistor 102). In various embodiments, the exact material compositions of the electrically conductive material 118 may be different when used to implement contacts to different electrodes of different transistors within the IC structure 100.

FIG. 1 further illustrates a gate stack 144 (labeled in FIGS. 1A-1C as gate stacks 144A, 144B, and 144C, respectively), provided over the channel portion of the III-N channel material 112. In the embodiments of FIGS. 1A and 1C, the gate stack 144 may include a layer of a gate dielectric material 120, and a gate electrode material 122. In the embodiment of FIG. 1B, the gate stack 144 does not include the gate dielectric material 120.

In some embodiments, the gate dielectric material 120 may be a high-k dielectric material, e.g., a material including elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric material 120 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric material 120 during manufacture of the III-N transistor 102 to improve the quality of the gate dielectric material 120. A thickness of the gate dielectric material 120 may be between 0.5 nanometers and 3 nanometers, including all values and ranges therein, e.g., between 1 and 3 nanometers, or between 1 and 2 nanometers.

The gate electrode material 122 may include at least one P-type work function metal or N-type work function metal, depending on whether the III-N transistor 102 is a PMOS transistor or an NMOS transistor (e.g., P-type work function metal may be used as the gate electrode material 122 when the transistors 102 is a PMOS transistor and N-type work function metal may be used as the gate electrode material 122 when the III-N transistor 102 is an NMOS transistor, depending on the desired threshold voltage). For a PMOS transistor, metals that may be used for the gate electrode material 122 may include, but are not limited to, ruthenium, palladium, platinum, cobalt, nickel, titanium nitride, and conductive metal oxides (e.g., ruthenium oxide). For an NMOS transistor, metals that may be used for the gate electrode material 122 include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and nitrides of these metals (e.g., tantalum nitride, and tantalum aluminum nitride). In some embodiments, the gate electrode material 122 may include a stack of two or more metal layers, where one or more metal layers are work function metal layers and at least one metal layer is a fill metal layer.

Further layers may be included next to the gate electrode material 122 for other purposes, such as to act as a diffusion barrier layer or/and an adhesion layer, not specifically shown in FIG. 1. Furthermore, in some embodiments, the gate dielectric material 120 and the gate electrode material 122 may be surrounded by a gate spacer, not shown in FIG. 1, configured to provide separation between the gates of different transistors. Such a gate spacer may be made of a low-k dielectric material (i.e., a dielectric material that has a lower dielectric constant (k) than silicon dioxide, which has a dielectric constant of 3.9). Examples of low-k materials that may be used as the dielectric gate spacer may include, but are not limited to, fluorine-doped silicon dioxide, carbon-doped silicon dioxide, spin-on organic polymeric dielectrics such as polyimide, polynorbornenes, benzocyclobutene, and polytetrafluoroethylene (PTFE), or spin-on silicon-based polymeric dielectric such as hydrogen silsesquioxane (HSQ) and methylsilsesquioxane (MSQ)). Other examples of low-k materials that may be used as the dielectric gate spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

In some embodiments, the IC structure 100 may, optionally, include a buffer material 124 between the III-N channel material 112 and the support structure 108, as shown in FIG. 1. In some embodiments, the buffer material 124 may be a layer of a semiconductor material that has a band gap larger than that of the III-N channel material 112, so that the buffer material 124 can serve to prevent current leakage from the future III-N transistor to the support structure 108. A properly selected semiconductor for the buffer material 124 may also enable better epitaxy of the III-N channel material 112 thereon, e.g., it may improve epitaxial growth of the III-N channel material 112, for instance in terms of a bridge lattice constant or amount of defects. For example, a semiconductor that includes aluminum, gallium, and nitrogen (e.g., AlGaN) or a semiconductor that includes aluminum and nitrogen (e.g., AlN) may be used as the buffer material 124 when the III-N channel material 112 is a semiconductor that includes gallium and nitrogen (e.g., GaN). Other examples of materials for the buffer material 124 may include materials typically used as ILD, described above, such as oxide isolation layers, e.g., silicon oxide, silicon nitride, aluminum oxide, and/or silicon oxynitride. When implemented in the III-N transistor 102, the buffer material 124 may have a thickness between about 100 and 5000 nm, including all values and ranges therein, e.g., between about 200 and 1000 nanometers, or between about 250 and 500 nanometers.

In some embodiments, the IC structure 100 may, optionally, include a hard-mask material 126 over the polarization material 114, as shown in FIG. 1. In some embodiments, the hard-mask material 126 may be silicon nitride.

Although not specifically shown in FIG. 1, the IC structure 100 may further include additional transistors similar to the III-N transistor 102, described above.

In some embodiments, the IC structure 100 may be included in, or used to implement at least a portion of an RF FE. In some embodiments, the III-N transistor 102 of the IC structure 100 may be included in, or used to implement at least a portion of an RF circuit or a part of a power circuit included in the IC structure.

Turning now to the details of the charge-induced threshold voltage tuning element illustrated in FIG. 1, the gate stack 144 of different embodiments of the IC structure 100 shown in FIG. 1 includes the doped semiconductor material 130 which may be used to tune the threshold voltage of the III-N transistors 102. In various embodiments, the doped semiconductor material 130 may be included between the gate electrode material 122 and the III-N semiconductor material 112 and may include dopant atoms in concentration of at least $1 \times 10^{18}$ cm$^{-3}$, e.g., of at least $1 \times 10^{19}$ cm$^{-3}$, of at least $1 \times 10^{20}$ cm$^{-3}$, or of at least $1 \times 10^{21}$ cm$^{-3}$. In some embodiments, the doped semiconductor material 130 may have a thickness between about 1 nanometer and 50 nanometers, including all values and ranges therein, e.g., between about 1 and 15 nanometers, or between about 1 and 5 nanometers.

In various embodiments, the doped semiconductor material 130 may include any suitable semiconductor material that may be deposited to be a part of the gate stack 144, at thicknesses and with concentrations of dopant atoms as described above. For example, in some embodiments, the doped semiconductor material 130 may include doped silicon, e.g., doped polysilicon. In other embodiments, the doped semiconductor material 130 may include doped III-N material, e.g., doped GaN, doped AlGaN, or doped AlInGaN.

In various embodiments, the dopant atoms of the doped semiconductor material 130 may be either N-type dopant atoms or P-type dopant atoms.

N-type dopant atoms (also commonly referred to as "donors") are dopant atoms that, when added to a semiconductor material, can form an N-type region (i.e., dopant atoms that have extra electrons that may move around the semiconductor material and carry a current, thus acting as charge carriers). If the semiconductor material 130 is silicon or another group IV semiconductor material or a combination of materials (e.g., germanium or silicon germanium), then N-type dopants of the doped semiconductor material 130 may include phosphorous, arsenic, or other group V atoms. If the semiconductor material 130 is a III-N material, then N-type dopants of the doped semiconductor material 130 may include silicon or germanium atoms. Including, in the gate stack 144 of the III-N transistor 102, a layer of the semiconductor material 130 with N-type dopant atoms adds positive charges to the semiconductor material 130. For example, when substituting a silicon atom in the crystal lattice of the semiconductor material 130 with a donor dopant atom, four of the valence electrons of the dopant atom (e.g., phosphorus or arsenic) form covalent bonds with the neighboring silicon atoms but the fifth one remains weakly bonded and the initially electro-neutral donor dopant atom becomes positively charged (ionized). Adding positive charges to the semiconductor material 130 by means of the providing N-type dopant atoms in the semiconductor material 130 may make the threshold voltage of the transistor more negative. Thus, if the transistor 102 without the doped semiconductor material 130 in the gate stack is designed to have a negative threshold voltage, then including in the gate stack 144 the doped semiconductor layer 130 with N-type dopant atoms would increase the absolute value of the threshold voltage (i.e., the threshold voltage would still be negative). On the other hand, if the transistor 102 without the doped semiconductor material 130 in the gate stack 144 is designed to have a positive threshold voltage, then including in the gate stack 144 the doped semiconductor layer 130 with N-type dopant atoms would decrease the threshold voltage, in which case the resulting threshold voltage may be either a smaller positive value or even become a negative threshold voltage.

P-type dopant atoms (also commonly referred to as "acceptors") are dopant atoms that, when added to a semiconductor material, can form a P-type region (i.e., dopant atoms that lack electrons, thereby causing holes to move around the semiconductor material and carry a current, thus acting as charge carriers). If the semiconductor material 130 is silicon or another group IV semiconductor material or a combination of materials, then P-type dopants of the doped semiconductor material 130 may include boron, aluminum, or other group III atoms. If the semiconductor material 130 is a III-N material, then P-type dopants of the doped semiconductor material 130 may include magnesium, carbon, or zinc. Including, in the gate stack 144 of the III-N transistor 102, a layer of the semiconductor material 130 with P-type dopant adds negative charges to the semiconductor material 130. For example, when substituting a silicon atom in the crystal lattice of the semiconductor material 130 with an acceptor dopant atom, three of the valence electrons of the dopant atom (e.g., boron or aluminum) may form covalent bonds with three of the neighboring silicon atoms but the bond with the fourth neighbor remains unsatisfied and the initially electro-neutral acceptor dopant atom becomes negatively charged (ionized). Adding negative charges to the semiconductor material 130 by means of the providing P-type dopant atoms in the semiconductor material 130 may make the threshold voltage of the transistor more positive. Thus, if the transistor 102 without the doped semiconductor material 130 in the gate stack is designed to have a positive threshold voltage, then including in the gate stack 144 the doped semiconductor layer 130 with P-type dopant atoms would increase the absolute value of the threshold voltage (i.e., the threshold voltage would still be positive). On the other hand, if the transistor 102 without the doped semiconductor material 130 in the gate stack 144 is designed to have a negative threshold voltage, then including in the gate stack 144 the doped semiconductor layer 130 with P-type dopant atoms would increase the threshold voltage (i.e., make it less negative), in which case the resulting threshold voltage may be either a negative value of a smaller absolute value, or may even become a positive threshold voltage.

Now turning to the differences between FIGS. 1A, 1B, and 1C, both FIGS. 1A and 1B illustrate embodiments where the polarization material 114 is between the III-N semiconductor material 112 and the gate electrode material 122, resulting in formation of 2DEG just below (e.g., within 1 to 5 nanometers below) the polarization material 114 (the 2DEG schematically illustrated in FIGS. 1A and 1B as a dotted line in the III-N channel material 112 just below the polarization material 114). For the embodiment illustrated in FIG. 1A, the gate stack 144A includes not only the gate electrode material 120 but also the gate dielectric material 120 as described above, and the doped semiconductor material 130 is provided between the gate electrode material 122 and the gate dielectric material 120. For the embodiment illustrated in FIG. 1B, the gate stack 144B includes the gate electrode material 120 but does not include the gate dielectric material 120 as described above, and the doped semiconductor material 130 interfaces (i.e., is in contact with, possibly resulting in a formation of an interfacial layer) the polarization material 114. The embodiment illustrated in FIG. 1C is similar to that of FIG. 1A in that the gate stack 144C also includes the gate dielectric material 120 and the doped semiconductor material 130 is between the gate electrode material 122 and the gate dielectric material 120. What is different in the embodiment illustrated in FIG. 1C is that, in the IC structure 100C, at least a portion of the III-N semiconductor material 112 is between the polarization material 114 and the gate electrode material 122, resulting in formation of 2DEG just above (e.g., within 3 to 5 nanometers above) the polarization material 114 (the 2DEG schematically illustrated in FIG. 1C as a dotted line in the III-N channel material 112 just above the polarization material 114). In other embodiments of the IC structure 100, not specifically shown in FIG. 1, the gate stack 144 may be the one without the gate dielectric material 120 (e.g., similar to the gate stack 144B shown in FIG. 1B), but at least a portion of the III-N semiconductor material 112 may be between the polarization material 114 and the gate electrode material 122 (e.g., similar to the illustration of FIG. 1C), resulting in formation of 2DEG just above the polarization material 114. In such embodiments, the doped semiconductor material 130 may interface the III-N semiconductor material 112.

III-N Transistors with Fixed Charge Materials Included in Gate Stacks

FIGS. 2A-2C provide cross-sectional side views illustrating different examples of IC structures 200A, 200B, and 200C, respectively (collectively referred to as "IC structures 200"), each of which includes a III-N transistor with a fixed charge material included in a gate stack to tune the threshold voltage of the transistor, according to some embodiments of the present disclosure. Each of FIGS. 2A-2C provides a cross-sectional side view (a view in an x-z plane of an example x-y-z coordinate system) illustrating an IC structure 200 with a III-N transistor 202 (labeled in FIGS. 2A-2C as transistors 202A, 202B, and 202C, respectively), an approximate boundary of which is illustrated in each of FIGS. 2A-2C with a thick dashed line. The views shown in FIGS. 2A-2C are similar to those shown in FIGS. 1A-1C and include some elements with the same reference numerals. Therefore, descriptions provided with reference to FIGS. 1A-1C are applicable to the IC structures 200 of FIGS. 2A-2C and, in the interests of brevity, are not repeated here. Instead, only the differences are described. Similar to FIGS. 1A-1C, a legend provided within a dashed box at the bottom of each of FIGS. 2A-2C illustrates colors/patterns used to indicate some materials or elements shown in FIGS. 2A-2C.

As stated above, the views shown in FIGS. 2A-2C are similar to those shown in FIGS. 1A-1C. In particular, FIG. 2A illustrates an embodiment where a gate stack of a III-N transistor includes a gate dielectric material and where a polarization material is included between the gate stack and a III-N channel material, FIG. 2B illustrates an embodiment where a gate stack of a III-N transistor does not include a gate dielectric material and where a polarization material is included between the gate stack and a III-N channel material, and FIG. 2C illustrates an embodiment where a gate stack of a III-N transistor includes a gate dielectric material and where a III-N channel material is included between the gate stack and a polarization material. What is different in FIGS. 2A-2C is that, instead of including the doped semiconductor material 130, the gate stacks 244 (labeled in FIGS. 2A-2C as gate stacks 244A, 244B, and 244C, respectively) of the transistors 202 include a fixed charge material 230.

In various embodiments, the fixed charge material 230 may be included between the gate electrode material 122 and the III-N semiconductor material 112 and may include fixed charges in concentration of at least $1 \times 10^{18}$ cm$^{-3}$, e.g., of at least $1 \times 10^{19}$ cm$^{-3}$, of at least $1 \times 10^{20}$ cm$^{-3}$, or of at least $1 \times 10^{21}$ cm$^{-3}$. In some embodiments, the fixed charge material 230 may have a thickness between about 1 nanometer and 10 nanometers, including all values and ranges therein, e.g., between about 1 and 5 nanometers, or between about 1 and 3 nanometers. In some embodiments, the thickness of the fixed charge material 230 in various embodiments of the IC structure 200 may be smaller than that of the doped semiconductor material 130 in various embodiments of the IC structure 100 because, with current fabrication processes, it may be easier, or more feasible, to include higher densities of fixed charges than of dopant atoms, which enables the fixed charge layers to be made thinner. Shall that change in the future, the thickness of the doped semiconductor material 130 may also be made thinner, e.g., to be on the order of values as those described for the fixed charge material 230.

In various embodiments, the fixed charge material 230 may include any suitable material that may be deposited to be a part of the gate stack 244, at thicknesses and with concentration of fixed charges as described above. For example, in some embodiments, the fixed charge material 230 may include a material includes lanthanum and oxygen (e.g., includes lanthanum oxide).

In various embodiments, the dopant atoms of the fixed charge material 230 may be either positive fixed charges or negative fixed charges.

Including, in the gate stack 244 of the III-N transistor 202, a layer of the fixed charge material 230 with positive fixed charges adds positive charges to the fixed charge material 230, which may make the threshold voltage of the transistor more negative. Thus, if the transistor 202 without the fixed charge material 230 in the gate stack is designed to have a negative threshold voltage, then including in the gate stack 244 the fixed charge material 230 with positive fixed charges would increase the absolute value of the threshold voltage (i.e., the threshold voltage would still be negative). On the other hand, if the transistor 202 without the fixed charge material 230 in the gate stack 244 is designed to have a positive threshold voltage, then including in the gate stack 244 the fixed charge material 230 with positive fixed charges would decrease the threshold voltage, in which case the resulting threshold voltage may be either a smaller positive value or even become a negative threshold voltage. Examples of materials that may be included in the gate stack 244 as the fixed charge material 230 with positive fixed charges include, but are not limited to, N-type doped semiconductor layers like Si-doped GaN/AlInGaN, or N-type polysilicon.

Including, in the gate stack 244 of the III-N transistor 202, a layer of the fixed charge material 230 with negative fixed charges adds negative charges to the fixed charge material 230. Thus, if the transistor 202 without the fixed charge material 230 in the gate stack is designed to have a positive threshold voltage, then including in the gate stack 244 the fixed charge material 230 with negative fixed charges would increase the absolute value of the threshold voltage (i.e., the threshold voltage would still be positive). On the other hand, if the transistor 202 without the fixed charge material 230 in the gate stack 244 is designed to have a negative threshold voltage, then including in the gate stack 244 the fixed charge material 230 with negative fixed charges would increase the threshold voltage (i.e., make it less negative), in which case the resulting threshold voltage may be either a negative value of a smaller absolute value, or may even become a positive threshold voltage. Examples of materials that may be included in the gate stack 244 as the fixed charge material 230 with negative fixed charges include, but are not limited to, P-type semiconductor layers like Mg-doped GaN/AlInGaN, or P-type polysilicon.

The differences between FIGS. 2A, 2B, and 2C are similar to the differences between FIGS. 1A, 1B, and 1C. Namely, both FIGS. 2A and 2B illustrate embodiments where the polarization material 114 is between the III-N semiconductor material 112 and the gate electrode material 122, resulting in formation of 2DEG just below (e.g., within 3 to 5 nanometers below) the polarization material 114 (the 2DEG schematically illustrated in FIGS. 2A and 2B as a dotted line in the III-N channel material 112 just below the polarization material 114). For the embodiment illustrated in FIG. 2A, the gate stack 244A includes not only the gate electrode material 120 but also the gate dielectric material 120 as described above, and the fixed charge material 230 is provided between the gate electrode material 122 and the gate dielectric material 120. For the embodiment illustrated in FIG. 2B, the gate stack 244B includes the gate electrode material 120 but does not include the gate dielectric material 120 as described above, and the fixed charge material 230 interfaces (i.e., is in contact with, possibly resulting in a formation of an interfacial layer) the polarization material 114. The embodiment illustrated in FIG. 2C is similar to that of FIG. 2A in that the gate stack 244C also includes the gate dielectric material 120 and the fixed charge material 230 is between the gate electrode material 122 and the gate dielectric material 120. What is different in the embodiment illustrated in FIG. 2C is that, in the IC structure 200C, at least a portion of the III-N semiconductor material 112 is between the polarization material 114 and the gate electrode material 122, resulting in formation of 2DEG just above (e.g., within 3 to 5 nanometers above) the polarization material 114 (the 2DEG schematically illustrated in FIG. 2C as a dotted line in the III-N channel material 112 just above the polarization material 114). In other embodiments of the IC structure 200, not specifically shown in FIG. 2, the gate stack 244 may be the one without the gate dielectric material 120 (e.g., similar to the gate stack 244B shown in FIG. 2B), but at least a portion of the III-N semiconductor material 112 may be between the polarization material 114 and the gate electrode material 122 (e.g., similar to the illustration of FIG. 2C), resulting in formation of 2DEG just above the polarization material 114. In such embodiments, the fixed charge material 230 may interface the III-N semiconductor material 112.

Although not specifically shown in FIG. 2, the IC structure 200 may further include additional transistors similar to the III-N transistor 202, described above.

In some embodiments, the IC structure 200 may be included in, or used to implement at least a portion of an RF FE. In some embodiments, the III-N transistor 202 of the IC structure 200 may be included in, or used to implement at least a portion of an RF circuit or a part of a power circuit included in the IC structure.

III-N Transistors with Doped Semiconductor Materials Included Under Gate Stacks

FIGS. 3A-3C provide cross-sectional side views illustrating different examples of IC structures 300A, 300B, and 300C, respectively (collectively referred to as "IC structures 300"), each of which includes a III-N transistor with a doped semiconductor material included underneath a gate stack to tune the threshold voltage of the transistor, according to some embodiments of the present disclosure. Each of FIGS. 3A-3C provides a cross-sectional side view (a view in an x-z plane of an example x-y-z coordinate system) illustrating an IC structure 300 with a III-N transistor 302 (labeled in FIGS. 3A-3C as transistors 302A, 302B, and 302C, respectively), an approximate boundary of which is illustrated in each of FIGS. 3A-3C with a thick dashed line. The views shown in FIGS. 3A-3C are similar to those shown in FIGS. 1A-1C and include some elements with the same reference numerals. Therefore, descriptions provided with reference to FIGS. 1A-1C are applicable to the IC structures 300 of FIGS. 3A-3C and, in the interests of brevity, are not repeated here. Instead, only the differences are described. Similar to FIGS.

1A-1C, a legend provided within a dashed box at the bottom of each of FIGS. 3A-3C illustrates colors/patterns used to indicate some materials or elements shown in FIGS. 3A-3C.

As stated above, the views shown in FIGS. 3A-3C are similar to those shown in FIGS. 1A-1C. In particular, FIG. 3A illustrates an embodiment where a gate stack of a III-N transistor includes a gate dielectric material and where a polarization material is included between the gate stack and a III-N channel material, FIG. 3B illustrates an embodiment where a gate stack of a III-N transistor does not include a gate dielectric material and where a polarization material is included between the gate stack and a III-N channel material, and FIG. 3C illustrates an embodiment where a gate stack of a III-N transistor includes a gate dielectric material and where a III-N channel material is included between the gate stack and a polarization material. What is different in FIGS. 3A-3C is that, instead of including the doped semiconductor material 130 in the gate stacks of the transistors 302, in the embodiments of FIGS. 3A-3C include a doped semiconductor material 330 under the gate stacks 344 (labeled in FIGS. 3A-3C as gate stacks 344A, 344B, and 344C, respectively).

In various embodiments, the doped semiconductor material 330 may be included between the gate stack 344 and the III-N channel stack of the polarization material 114 and the III-N semiconductor material 112. In various embodiments, the doped semiconductor material 330 may include dopant atoms in concentration of at least $1\times10^{18}$ cm$^{-3}$, e.g., of at least $1\times10^{19}$ cm$^{-3}$, of at least $1\times10^{20}$ cm$^{-3}$, or of at least $1\times10^{21}$ cm$^{-3}$. In some embodiments, the doped semiconductor material 330 may have a thickness between about 1 nanometer and 50 nanometers, including all values and ranges therein, e.g., between about 1 and 15 nanometers, or between about 1 and 5 nanometers. In general, the doped semiconductor material 330 may be of any thickness as long as the densities of dopant atoms as described above may be achieved. In some implementations, it may be preferable to reduce the thickness of the doped semiconductor material 330 (as long as sufficient amount of positive or negative charges may be included in the material). In some embodiments, the same may apply to the thicknesses of the doped semiconductor material 130 and the fixed charge material 230, described above).

In various embodiments, the doped semiconductor material 330 may include any suitable material that may be deposited underneath the gate stack 344, at thicknesses and with concentration of dopant atoms as described above. For example, in some embodiments, the doped semiconductor material 330 may include doped GaN, doped AlGaN, and/or doped AlInGaN.

In various embodiments, the dopant atoms of the doped semiconductor material 330 may be either N-type dopant atoms or P-type dopant atoms.

Including, between the gate stack 344 and the III-N channel stack of the III-N transistor 302, a layer of the doped semiconductor material 330 with N-type dopant atoms adds positive charges to the doped semiconductor material 330, which may make the threshold voltage of the transistor more negative. Thus, if the transistor 302 without the doped semiconductor material 330 under the gate stack 344 is designed to have a negative threshold voltage, then including, between the gate stack 344 and the III-N channel stack of the III-N transistor 302, the doped semiconductor material 330 with N-type dopant atoms would increase the absolute value of the threshold voltage (i.e., the threshold voltage would still be negative). On the other hand, if the transistor 302 without the doped semiconductor material 330 under the gate stack 344 is designed to have a positive threshold voltage, then including, between the gate stack 344 and the III-N channel stack of the III-N transistor 302, the doped semiconductor material 330 with N-type dopant atoms would decrease the threshold voltage, in which case the resulting threshold voltage may be either a smaller positive value or even become a negative threshold voltage. Examples of N-type dopant atoms that may be included in the doped semiconductor material 330 such as GaN, AlGaN, or AlInGaN include, but are not limited to, silicon or germanium atoms.

Including, between the gate stack 344 and the III-N channel stack of the III-N transistor 302, a layer of the doped semiconductor material 330 with P-type dopant atoms adds negative charges to the doped semiconductor material 330. Thus, if the transistor 302 without the doped semiconductor material 330 under the gate stack is designed to have a positive threshold voltage, then including, between the gate stack 344 and the III-N channel stack of the III-N transistor 302, the doped semiconductor material 330 with P-type dopant atoms would increase the absolute value of the threshold voltage (i.e., the threshold voltage would still be positive). On the other hand, if the transistor 302 without the doped semiconductor material 330 under the gate stack 344 is designed to have a negative threshold voltage, then including, between the gate stack 344 and the III-N channel stack of the III-N transistor 302, the doped semiconductor material 330 with P-type dopant atoms would increase the threshold voltage (i.e., make it less negative), in which case the resulting threshold voltage may be either a negative value of a smaller absolute value, or may even become a positive threshold voltage. Examples of P-type dopant atoms that may be included in the doped semiconductor material 330 such as GaN, AlGaN, or AlInGaN include, but are not limited to, magnesium, carbon, or zinc.

The differences between FIGS. 3A, 3B, and 3C are similar to the differences between FIGS. 1A, 1B, and 1C. Namely, both FIGS. 3A and 3B illustrate embodiments where the polarization material 114 is between the III-N semiconductor material 112 and the gate electrode material 122, resulting in formation of 2DEG just below (e.g., within 3 to 5 nanometers below) the polarization material 114 (the 2DEG schematically illustrated in FIGS. 3A and 3B as a dotted line in the III-N channel material 112 just below the polarization material 114). For the embodiment illustrated in FIG. 3A, the gate stack 344A includes not only the gate electrode material 120 but also the gate dielectric material 120 as described above, the doped semiconductor material 330 is provided between the polarization material 114 and the gate dielectric material 120, and the gate dielectric material 120 is between the doped semiconductor material 330 and the gate electrode material 122. For the embodiment illustrated in FIG. 3B, the gate stack 344B includes the gate electrode material 120 but does not include the gate dielectric material 120 as described above, and the doped semiconductor material 330 interfaces (i.e., is in contact with, possibly resulting in a formation of an interfacial layer) the gate electrode material 122. The embodiment illustrated in FIG. 3C is similar to that of FIG. 3A in that the gate stack 344C also includes the gate dielectric material 120 and the doped semiconductor material 330 is provided between the polarization material 114 and the gate dielectric material 120. What is different in the embodiment illustrated in FIG. 3C is that, in the IC structure 300C, the doped semiconductor material 330 is provided between the gate dielectric material 120 and the III-N channel material 112, and the III-N channel material 112 is between the doped semiconductor material 330 and the polarization material 114, resulting in formation of 2DEG just above (e.g., within 3 to 5 nanometers above) the polarization material 114 (the 2DEG schematically illustrated in FIG. 3C as a dotted line in the III-N channel material 112 just above the polarization material 114). In such embodiments, at least portions of the doped semiconductor material 330 may interface (e.g., be in contact with) the gate dielectric material 120 on one side and the III-N channel material 112 on the other. In other embodiments of the IC structure 300, not specifically shown in FIG. 3, the gate stack 344 may be the one without the gate dielectric material 120 (e.g., similar to the gate stack 344B shown in FIG. 3B), but at least a portion of the III-N semiconductor material 112 may be between the polarization material 114 and the gate electrode material 122 (e.g., similar to the illustration of FIG. 3C), resulting in formation of 2DEG just above the polarization material 114. In such embodiments, the doped semiconductor material 330 may interface the gate electrode material 112.

Although not specifically shown in FIG. 3, the IC structure 300 may further include additional transistors similar to the III-N transistor 302, described above.

In some embodiments, the IC structure 300 may be included in, or used to implement at least a portion of an RF FE. In some embodiments, the III-N transistor 302 of the IC structure 300 may be included in, or used to implement at least a portion of an RF circuit or a part of a power circuit included in the IC structure.

Variations and Implementations

The IC structures 100/200/300 illustrated in FIGS. 1-3 do not represent an exhaustive set of assemblies in which at least one III-N transistor with at least one charge-induced threshold voltage tuning element as described herein may be implemented, but merely provide examples of such structures/assemblies.

Although particular arrangements of materials are discussed with reference to FIGS. 1-3, intermediate materials may be included in various portions of these figures. Note that FIGS. 1-3 are intended to show relative arrangements of some of the components therein, and that various device components of these figures may include other components that are not specifically illustrated, e.g., various interfacial layers or various additional layers or elements. For example, although not specifically shown, the IC structures 100/200/300 may include a solder resist material (e.g., polyimide or similar material) and one or more bond pads formed on upper-most interconnect layer of the IC structure, e.g., at the top of the IC structures 100/200/300 shown in FIGS. 1-3. The bond pads may be electrically coupled with a further interconnect structure and configured to route the electrical signals between one or more transistors 102/202/302 and various external devices. For example, solder bonds may be formed on the one or more bond pads to mechanically and/or electrically couple a chip including the IC structures 100/200/300 with other components (e.g., a circuit board). The IC structures 100/200/300 may have other alternative configurations to route the electrical signals from the interconnect layers, e.g., the bond pads described above may be replaced by or may further include other analogous features (e.g., posts) that route the electrical signals to external components.

Additionally, although some elements of the IC structures are illustrated in FIGS. 1-3 as being planar rectangles or formed of rectangular solids, this is simply for ease of illustration, and embodiments of various ones of these elements may be curved, rounded, or otherwise irregularly shaped as dictated by, and sometimes inevitable due to, the manufacturing processes used to fabricate semiconductor device assemblies. For example, while FIGS. 1-3 may illustrate various elements, e.g., the S/D regions 116, the S/D electrodes 142, etc., as having perfectly straight sidewall profiles, i.e., profiles where the sidewalls extend perpendicularly to the support structure 108, these idealistic profiles may not always be achievable in real-world manufacturing processes. Namely, while designed to have straight sidewall profiles, real-world openings that may be formed as a part of fabricating various elements of the IC structures shown in FIGS. 1-3 may end up having either so-called "re-entrant" profiles, where the width at the top of the opening is smaller than the width at the bottom of the opening, or "non-re-entrant" profile, where the width at the top of the opening is larger than the width at the bottom of the opening. Oftentimes, as a result of a real-world opening not having perfectly straight sidewalls, imperfections may form within the materials filling the opening. For example, typical for re-entrant profiles, a void may be formed in the center of the opening, where the growth of a given material filling the opening pinches off at the top of the opening. Therefore, descriptions of various embodiments of integrating into at least one III-N transistor of at least one charge-induced threshold voltage tuning element provided herein are equally applicable to embodiments where various elements of such integrated structures look different from those shown in the figures due to manufacturing processes used to form them.

In addition, in various further embodiments, any features of any one of the embodiments described herein may be combined with any features of any other embodiments described herein. For example, in some embodiments, IC structures may include any combination of two or more of the charge-induced threshold voltage tuning elements as illustrated in FIGS. 1-3. For example, in some embodiments, any of the IC structures 100 may further include the fixed charge material 230 as described with reference to any of the IC structures 200. In another example, in some embodiments, any of the IC structures 100 may further include the doped semiconductor material 330 as described with reference to any of the IC structures 300. In yet another example, in some embodiments, any of the IC structures 200 may further include the doped semiconductor material 330 as described with reference to any of the IC structures 300.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of the integration of one or more charge-induced threshold voltage tuning elements into a transistor, e.g., into a III-N transistor, as described herein.

Figures 4A, 4B, 4C:
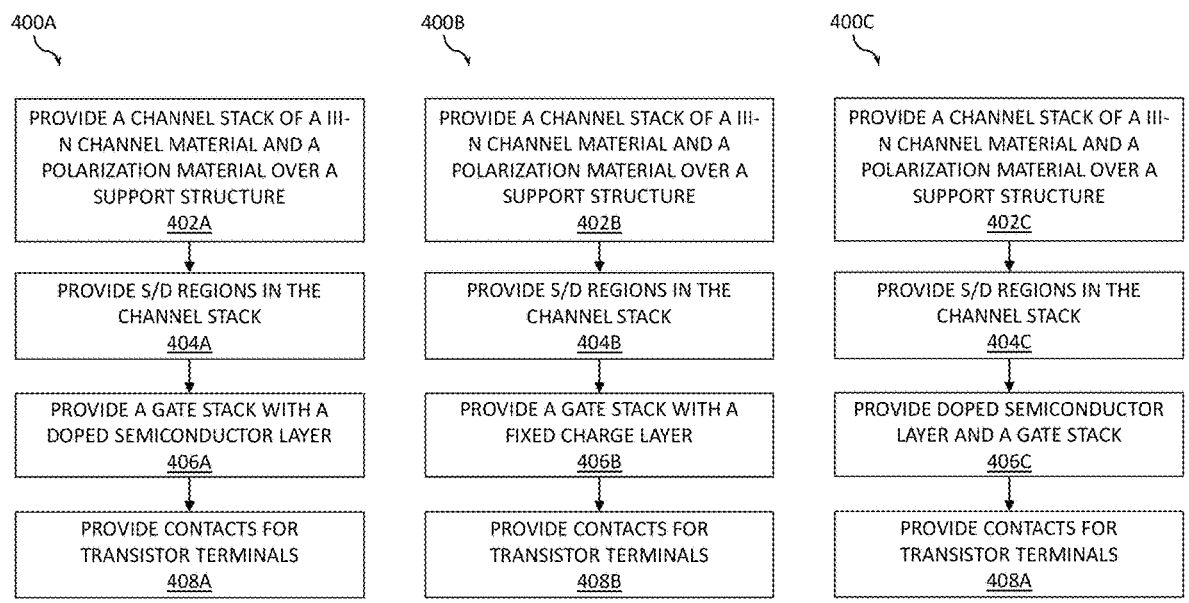
FIG. 4A is a flow diagram of an example method of manufacturing an IC structure that includes a III-N transistor with a doped semiconductor material included in a gate stack, according to some embodiments of the present disclosure.
FIG. 4B is a flow diagram of an example method of manufacturing an IC structure that includes a III-N transistor with a fixed charge material included in a gate stack, according to some embodiments of the present disclosure.
FIG. 4C is a flow diagram of an example method of manufacturing an IC structure that includes a III-N transistor with a doped semiconductor material included between a gate stack and a III-N channel stack, according to some embodiments of the present disclosure.

Manufacturing IC Structures with Various Charge-Induced Threshold Voltage Tuning Elements The IC structures implementing at least one III-N transistor with at least one charge-induced threshold voltage tuning element as described herein may be manufactured using any suitable techniques. FIGS. 4A-4C illustrates some examples of such methods. However, other examples of manufacturing any of the IC structures described herein, as well as larger devices and assemblies that include such structures (e.g., as shown in FIGS. 6-9) are also within the scope of the present disclosure.

FIG. 4A is a flow diagram of an example method 400A of manufacturing an IC structure that includes a III-N transistor with a doped semiconductor material included in a gate stack, e.g., any embodiments of the IC structures 100 described with reference to FIG. 1, according to some embodiments of the present disclosure. FIG. 4B is a flow diagram of an example method 400B of manufacturing an IC structure that includes a III-N transistor with a fixed charge material included in a gate stack, e.g., any embodiments of the IC structures 200 described with reference to FIG. 2, according to some embodiments of the present disclosure. FIG. 4C is a flow diagram of an example method 400C of manufacturing an IC structure that includes a III-N transistor with a doped semiconductor material included between a gate stack and a III-N channel stack, e.g., any embodiments of the IC structures 300 described with reference to FIG. 3, according to some embodiments of the present disclosure. Although the operations of each of the methods 400A, 400B, and 400C are illustrated once each and in a particular order, the operations may be performed in any suitable order and repeated as desired. For example, one or more operations may be performed in parallel to manufacture, substantially simultaneously, multiple transistors with at least one charge-induced threshold voltage tuning element as described herein. In another example, the operations may be performed in a different order to reflect the structure of a particular device assembly in which at least one transistor with at least one charge-induced threshold voltage tuning element as described herein will be included. Yet in another example, the operations of any two or more of the methods 400A, 400B, and 400C may be combined to manufacture at least one transistor with more than one charge-induced threshold voltage tuning elements as described herein.

In addition, the example manufacturing methods 400A, 400B, and 400C may include other operations not specifically shown in FIG. 4, such as various cleaning or planarization operations as known in the art. For example, in some embodiments, the support structure 108, as well as layers of various other materials subsequently deposited thereon, may be cleaned prior to, after, or during any of the processes of the methods 400A, 400B, and 400C described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the structures/assemblies described herein may be planarized prior to, after, or during any of the processes of the methods 400A, 400B, and 400C described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Turning to FIG. 4A, the method 400A may begin with providing a III-N channel stack over a support structure (a process 402A shown in FIG. 4A). In some embodiments of the process 402A, first, the buffer material 124 may be provided over the support structure 108, and then the III-N channel material 112 may be provided over the buffer material 130. In some embodiments, the process 402A may also include depositing the polarization material 114 over the III-N channel material 112 (e.g., as shown in FIGS. 1A and 1B). In other embodiments, the III-N channel stack provided in the process 402A may include the III-N channel material 112 deposited over the polarization material 114 (e.g., as shown in FIG. 1C).

In some embodiments, the process 402A may include epitaxially growing various transistor films, e.g., for forming the buffer material 124, the III-N channel material 112, and the polarization material 114. In this context, "epitaxial growth" refers to the deposition of substantially crystalline overlayers in the form of the desired materials. The epitaxial growth of various layers of the process 402A may be carried out using any known gaseous or liquid precursors for forming the desired material layers.

The method 400A may then proceed with providing S/D regions in the III-N channel stack provided in the process 402A (a process 404A shown in FIG. 4A). The process 404A may include forming the S/D regions 116 in the upper portion of the one or more materials provided in the process 402A, e.g., as shown with any of the IC structures 100 shown in FIGS. 1A-1C.

In some embodiments of the process 404A, the S/D regions 116 or different portions thereof may be formed using an implantation/diffusion process or an etching/deposition process, for example. In the former process, dopants such as boron, aluminum, antimony, phosphorous, or arsenic may be ion-implanted into the one or more materials provided in the process 402A (in particular, into the III-N channel material 112) to form the S/D regions 116 or different portions thereof. An annealing process that activates the dopants and causes them to diffuse farther into the III-N channel material 112 may follow the ion-implantation process. In some embodiments, annealing may be performed at temperatures above about 600 degrees Celsius, e.g., at temperatures between about 600 and 1200 degrees Celsius, or at temperatures between about 800 or 1000 and 1200 degrees Celsius. In the latter process, the one or more materials provided in the process 402A (in particular, into the III-N channel material 112) may first be etched to form recesses at the locations of the S/D regions 116, or different portions thereof. An epitaxial deposition process may then be carried out to fill the recesses with material that is used to fabricate the S/D regions 116, e.g., with the highly doped semiconductor material as described above. In further embodiments, one or more layers of metal and/or metal alloys may be used to form the S/D regions 116 or different portions thereof.

The method 400A may then proceed with providing a gate stack over a portion of the III-N channel stack that is between the source and the drain regions provided in the process 404A (a process 406A shown in FIG. 4A), where the gate stack includes a doped semiconductor material. The process 406A may include providing the gate stack 144 having the doped semiconductor material 130, e.g., as shown with any of the IC structures 100 shown in FIGS. 1A-1C. In some embodiments of the process 406A, the doped semiconductor material 130 may be providing by epitaxial growth with dopant atoms included therein, using suitable precursors.

The method 400A may also include providing contacts for various transistor terminals (a process 408A shown in FIG. 4A). For example, the process 408A may include providing the S/D contacts/electrodes 142 to be electrically coupled to respective S/D regions 116 and providing a gate contact/electrode to be electrically coupled to the gate stack 144, e.g., as shown with the contacts of the electrically conductive material 118 in the IC structures 100 shown in FIGS. 1A-1C.

Turning to FIG. 4B, the method 400B may include processes 402B, 404B, and 408B, analogous to, respectively, processes 402A, 404A, and 408A, described above, which descriptions, therefore, in the interest of brevity, are not repeated here. The method 400B may also include providing a gate stack over a portion of the III-N channel stack that is between the source and the drain regions provided in the process 404B (a process 406B shown in FIG. 4B), where the gate stack includes a fixed charge material. The process 406B may include providing the gate stack 244 having the fixed charge material 230, e.g., as shown with any of the IC structures 200 shown in FIGS. 2A-2C. In some embodiments of the process 406B, the fixed charge material 230 may be providing by epitaxial growth with fixed charges included therein, using suitable precursors.

Turning to FIG. 4C, the method 400C may include processes 402C, 404C, and 408C, analogous to, respectively, processes 402A, 404A, and 408A, described above, which descriptions, therefore, in the interest of brevity, are not repeated here. The method 400C may also include providing a doped semiconductor material and gate stack over a portion of the III-N channel stack that is between the source and the drain regions provided in the process 404C (a process 406C shown in FIG. 4C), where the doped semiconductor material is provided prior to providing the gate stack. The process 406C may include providing the doped semiconductor material 330, and then providing the gate stack 344 over the doped semiconductor material 330, e.g., as shown with any of the IC structures 300 shown in FIGS. 3A-3C. In some embodiments of the process 406C, the doped semiconductor material 330 may be providing by epitaxial growth with dopant atoms included therein, using suitable precursors.

In various embodiments, various processes of the methods 400A, 400B, and 400C may include any suitable deposition and patterning techniques for fabricating portions of at least one transistor, e.g., at least one III-N transistor, with at least one charge-induced threshold voltage tuning element as described herein. For example, any suitable deposition techniques may be used to deposit various insulating/dielectric materials, such as, but not limited to, spin-coating, dip-coating, atomic layer deposition (ALD), chemical vapor deposition (CVD), or physical vapor deposition (PVD) (e.g., evaporative deposition, magnetron sputtering, or e-beam deposition). Examples of deposition techniques that may be used to provide various contact/electrode materials include, but are not limited to, ALD, CVD, PVD (including sputtering), or electroplating. Examples patterning techniques that may be used in any of the processes of the methods 400A, 400B, and 400C may include, but are not limited to, photolithographic or electron-beam (e-beam) patterning, possibly in conjunction with a suitable etching technique, e.g., a dry etch, such as RF reactive ion etch (RIE) or inductively coupled plasma (ICP) RIE. In various embodiments, any of the etches performed in the methods 400A, 400B, and 400C may include an anisotropic etch, using etchants in a form of e.g., chemically active ionized gas (i.e., plasma) using e.g., bromine (Br) and chloride (Cl) based chemistries. In some embodiments, during any of the etches of the methods 400A, 400B, and 400C, the IC structure may be heated to elevated temperatures, e.g., to temperatures between about room temperature and 200 degrees Celsius, including all values and ranges therein, to promote that byproducts of the etch are made sufficiently volatile to be removed from the surface.

Example Structures and Devices with Charge-Induced Threshold Voltage Tuning Elements IC structures that include at least one transistor arrangement with one or more charge-induced threshold voltage tuning elements as disclosed herein may be included in any suitable electronic device. FIGS. 5-9 illustrate various examples of devices and components that may include at least one transistor arrangement, e.g., at least one III-N transistor, with one or more charge-induced threshold voltage tuning elements as disclosed herein. For example, in various examples, the one or more charge-induced threshold voltage tuning elements that may be included in devices and components of FIGS. 5-9 may include one or more of: doped semiconductor material in the gate stack as described with reference to FIG. 1, fixed charge material in the gate stack as described with reference to FIG. 2, and doped semiconductor material under the gate stack as described with reference to FIG. 3.

Figures 5A, 5B:
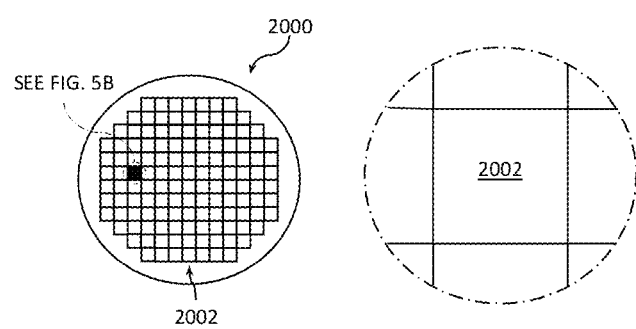
FIGS. 5A-5B are top views of a wafer and dies that include one or more IC structures having at least one III-N transistor with at least one charge-induced threshold voltage tuning element in accordance with any of the embodiments of the present disclosure.

FIGS. 5A-5B are top views of a wafer 2000 and dies 2002 that may include at least one transistor arrangement with one or more charge-induced threshold voltage tuning elements in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 6. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including at least one transistor arrangement with one or more charge-induced threshold voltage tuning elements as described herein). After the fabrication of the semiconductor product is complete (e.g., after manufacture of at least one transistor arrangement with one or more charge-induced threshold voltage tuning elements as described herein, e.g., after manufacture of any embodiment of the IC structures 100/200 described herein), the wafer 2000 may undergo a singulation process in which each of the dies 2002 is separated from one another to provide discrete "chips" of the semiconductor product. In particular, devices that include at least one transistor arrangement with one or more charge-induced threshold voltage tuning elements as disclosed herein may take the form of the wafer 2000 (e.g., not singulated) or the form of the die 2002 (e.g., singulated). The die 2002 may include one or more transistors with one or more charge-induced threshold voltage tuning elements as described herein, as well as, optionally, supporting circuitry to route electrical signals to these transistors and other devices, as well as any other IC components. In some embodiments, the wafer 2000 or the die 2002 may implement an RF FE device, a memory device (e.g., a static random-access memory (SRAM) device), a logic device (e.g., an AND, OR, NAND, or NOR gate), or any other suitable circuit element. Multiple ones of these devices may be combined on a single die 2002.

Figure 6:
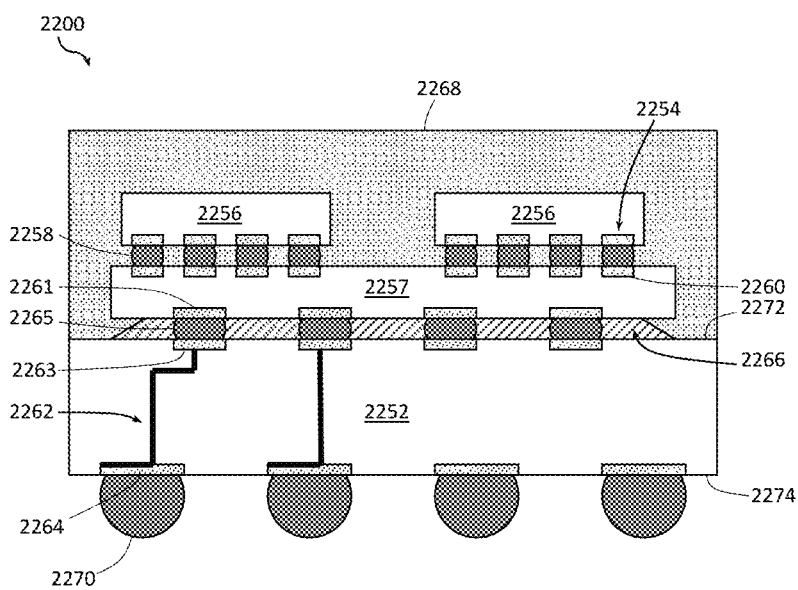
FIG. 6 is a cross-sectional side view of an IC package that may include one or more IC structures having at least one III-N transistor with at least one charge-induced threshold voltage tuning element in accordance with any of the embodiments of the present disclosure.

FIG. 6 is a side, cross-sectional view of an example IC package 2200 that may include an IC structure with at least one transistor arrangement with one or more charge-induced threshold voltage tuning elements in accordance with any of the embodiments disclosed herein. In some embodiments, the IC package 2200 may be a system-in-package (SiP).

As shown in FIG. 6, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 6 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 6 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 6 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 7.

The dies 2256 may take the form of any of the embodiments of the die 2002 discussed herein and may include any of the embodiments of an IC structure having at least one transistor arrangement with one or more charge-induced threshold voltage tuning elements, described herein. In embodiments in which the IC package 2200 includes multiple dies 2256, the IC package 2200 may be referred to as a multi-chip-package (MCP). The dies 2256 may include circuitry to perform any desired functionality. For example, one or more of the dies 2256 may be RF FE dies which may include one or more IC structures having at least one transistor arrangement with one or more charge-induced threshold voltage tuning elements as described herein, one or more of the dies 2256 may be logic dies (e.g., silicon-based dies), one or more of the dies 2256 may be memory dies (e.g., high bandwidth memory), etc. In some embodiments, any of the dies 2256 may include transistor arrangements with one or more charge-induced threshold voltage tuning elements, e.g., as discussed above; in some embodiments, at least some of the dies 2256 may not include any transistor arrangements with charge-induced threshold voltage tuning elements as described herein.

The IC package 2200 illustrated in FIG. 6 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 6, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 7:
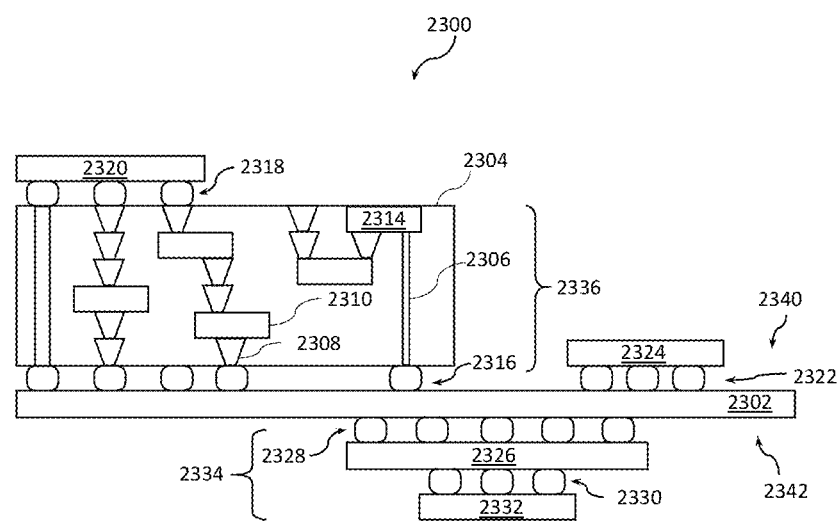
FIG. 7 is a cross-sectional side view of an IC device assembly that may include one or more IC structures having at least one III-N transistor with at least one charge-induced threshold voltage tuning element in accordance with any of the embodiments of the present disclosure.

FIG. 7 is a cross-sectional side view of an IC device assembly 2300 that may include components having one or more IC structures implementing at least one transistor arrangement with one or more charge-induced threshold voltage tuning elements in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC structures implementing at least one transistor arrangement with one or more charge-induced threshold voltage tuning elements in accordance with any of the embodiments disclosed herein; e.g., any of the IC packages discussed below with reference to the IC device assembly 2300 may take the form of any of the embodiments of the IC package 2200 discussed above with reference to FIG. 6 (e.g., may include at least one transistor arrangement with one or more charge-induced threshold voltage tuning elements in/on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 7 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 7), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 5B), an IC device (e.g., the IC structure of FIGS. 1-2), or any other suitable component. In particular, the IC package 2320 may include at least one transistor arrangement with one or more charge-induced threshold voltage tuning elements as described herein. Although a single IC package 2320 is shown in FIG. 7, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 7, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as further RF devices, PAs, power management devices, antennas, arrays, sensors, and microelectromechanical systems (MEMS) devices may also be formed on the interposer 2304. In some embodiments, the IC structures implementing at least one transistor arrangement with one or more charge-induced threshold voltage tuning elements as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 7 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 8:
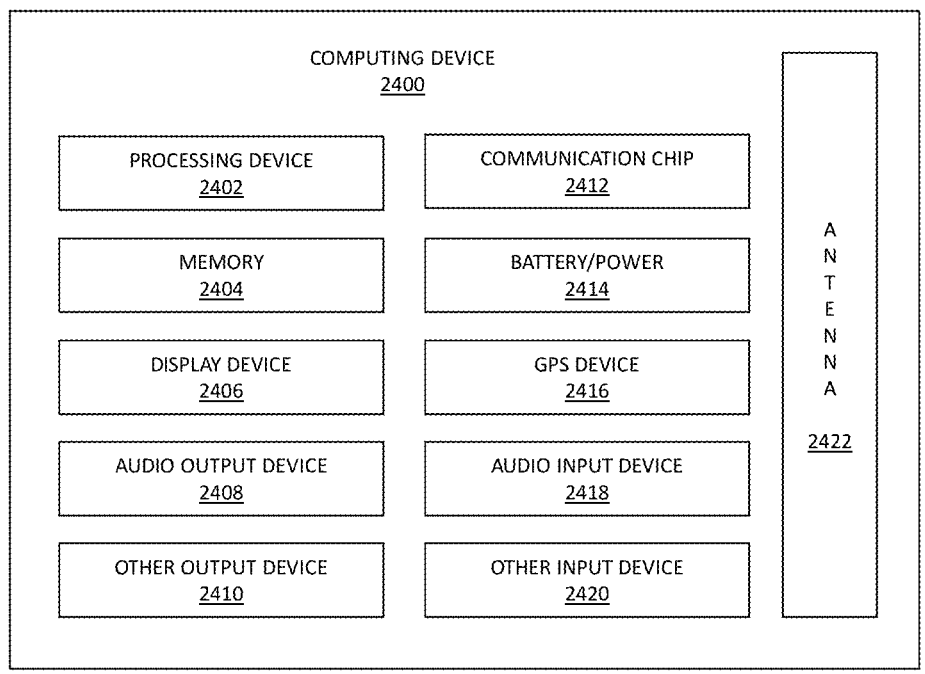
FIG. 8 is a block diagram of an example computing device that may include one or more IC structures having at least one III-N transistor with at least one charge-induced threshold voltage tuning element in accordance with any of the embodiments of the present disclosure.

FIG. 8 is a block diagram of an example computing device 2400 that may include one or more components with one or more IC structures having at least one transistor arrangement with one or more charge-induced threshold voltage tuning elements in accordance with any of the embodiments disclosed herein. For example, any suitable ones of the components of the computing device 2400 may include a die (e.g., the die 2002 (FIG. 5B)) including at least one transistor arrangement with one or more charge-induced threshold voltage tuning elements in accordance with any of the embodiments disclosed herein. Any of the components of the computing device 2400 may include an IC device (e.g., any embodiment of the IC structure of FIGS. 1-2) and/or an IC package 2200 (FIG. 6). Any of the components of the computing device 2400 may include an IC device assembly 2300 (FIG. 7).

A number of components are illustrated in FIG. 8 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 8, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-M RAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC structures as described herein may be particularly advantageous for use within the one or more communication chips 2412, described above. For example, such IC structures, in particular transistor arrangements with one or more charge-induced threshold voltage tuning elements as described herein, may be used to implement one or more of RF switches, PAs, LNAs, filters (including arrays of filters and filter banks), upconverters, downconverters, and duplexers, e.g., as a part of implementing the communication chips 2412.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 9:
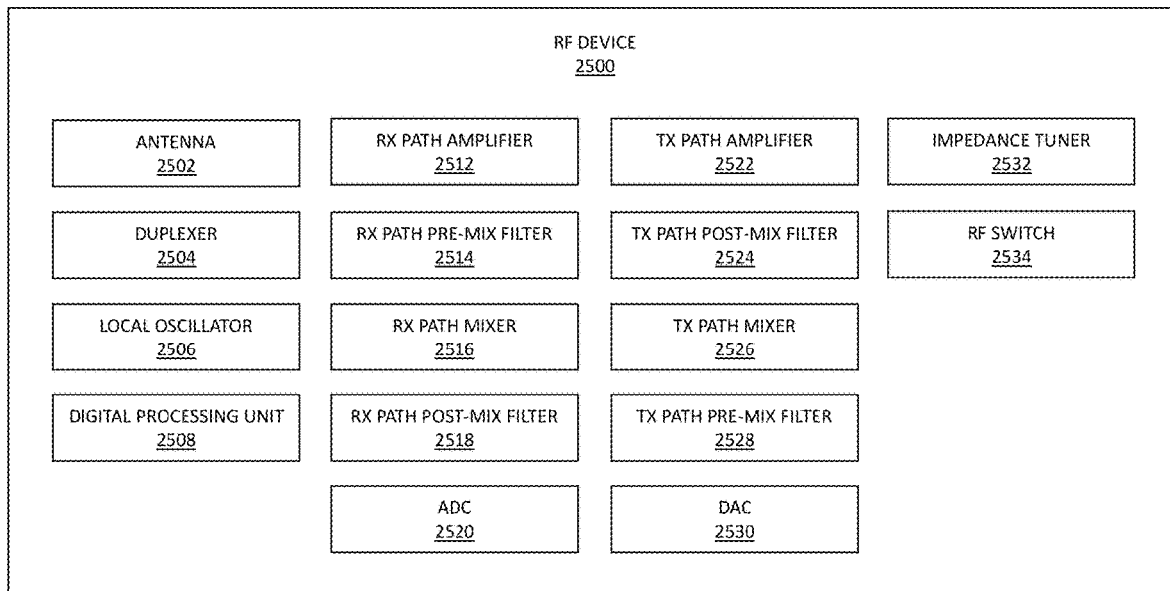
FIG. 9 is a block diagram of an example RF device that may include one or more IC structures having at least one III-N transistor with at least one charge-induced threshold voltage tuning element in accordance with any of the embodiments of the present disclosure.

FIG. 9 is a block diagram of an example RF device 2500 that may include one or more components with one or more IC structures having at least one transistor arrangement with one or more charge-induced threshold voltage tuning elements in accordance with any of the embodiments disclosed herein. For example, any suitable ones of the components of the RF device 2500 may include a die (e.g., the die 2002 as described with reference to FIG. 5 or a die implementing the IC structure as described with reference to FIG. 1 or 2) including at least one transistor arrangement with one or more charge-induced threshold voltage tuning elements in accordance with any of the embodiments disclosed herein. Any of the components of the RF device 2500 may include an IC device (e.g., the IC structure of FIGS. 1-2) and/or an IC package 2200 as described with reference to FIG. 6. Any of the components of the RF device 2500 may include an IC device assembly 2300 as described with reference to FIG. 7. In some embodiments, the RF device 2500 may be included within any components of the computing device 2400 as described with reference to FIG. 8, or may be coupled to any of the components of the computing device 2400, e.g., be coupled to the memory 2404 and/or to the processing device 2402 of the computing device 2400. In still other embodiments, the RF device 2500 may further include any of the components described with reference to FIG. 8, such as, but not limited to, the battery/power circuit 2414, the memory 2404, and various input and output devices as shown in FIG. 8.

In general, the RF device 2500 may be any device or system that may support wireless transmission and/or reception of signals in the form of electromagnetic waves in the RF range of approximately 3 kiloHertz (kHz) to 300 gigaHertz (GHz). In some embodiments, the RF device 2500 may be used for wireless communications, e.g., in a BS or a UE device of any suitable cellular wireless communications technology, such as GSM, WCDMA, or LTE. In a further example, the RF device 2500 may be used as, or in, e.g., a BS or a UE device of a millimeter-wave wireless technology such as fifth generation (5G) wireless (i.e., high-frequency/short wavelength spectrum, e.g., with frequencies in the range between about 20 and 60 GHz, corresponding to wavelengths in the range between about 5 and 15 millimeters). In yet another example, the RF device 2500 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 2500 may be used for wireless communications using Bluetooth technology (e.g., a frequency band from about 2.4 to about 2.485 GHz, corresponding to a wavelength of about 12 cm). In other embodiments, the RF device 2500 may be used for transmitting and/or receiving RF signals for purposes other than communication, e.g., in an automotive radar system, or in medical applications such as magneto-resonance imaging (MRI).

In various embodiments, the RF device 2500 may be included in frequency-division duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

A number of components are illustrated in FIG. 9 as included in the RF device 2500, but any one or more of these components may be omitted or duplicated, as suitable for the application. For example, in some embodiments, the RF device 2500 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2500 may be an RF device supporting only wireless reception (e.g., an RF receiver), in which case it may include the components of the RX path, but not the components of the TX path; or the RF device 2500 may be an RF device supporting only wireless transmission (e.g., an RF transmitter), in which case it may include the components of the TX path, but not the components of the RX path.

In some embodiments, some or all of the components included in the RF device 2500 may be attached to one or more motherboards. In some embodiments, some or all of these components are fabricated on a single die, e.g., on a single SoC die.

Additionally, in various embodiments, the RF device 2500 may not include one or more of the components illustrated in FIG. 9, but the RF device 2500 may include interface circuitry for coupling to the one or more components. For example, the RF device 2500 may not include an antenna 2502, but may include antenna interface circuitry (e.g., a matching circuitry, a connector and driver circuitry) to which an antenna 2502 may be coupled. In another set of examples, the RF device 2500 may not include a digital processing unit 2508 or a local oscillator 2506, but may include device interface circuitry (e.g., connectors and supporting circuitry) to which a digital processing unit 2508 or a local oscillator 2506 may be coupled.

As shown in FIG. 9, the RF device 2500 may include an antenna 2502, a duplexer 2504, a local oscillator 2506, a digital processing unit 2508. As also shown in FIG. 9, the RF device 2500 may include an RX path that may include an RX path amplifier 2512, an RX path pre-mix filter 2514, a RX path mixer 2516, an RX path post-mix filter 2518, and an analog-to-digital converter (ADC) 2520. As further shown in FIG. 9, the RF device 2500 may include a TX path that may include a TX path amplifier 2522, a TX path post-mix filter 2524, a TX path mixer 2526, a TX path pre-mix filter 2528, and a digital-to-analog converter (DAC) 2530. Still further, the RF device 2500 may further include an impedance tuner 2532, an RF switch 2534, and control logic 2536. In various embodiments, the RF device 2500 may include multiple instances of any of the components shown in FIG. 9. In some embodiments, the RX path amplifier 2512, the TX path amplifier 2522, the duplexer 2504, and the RF switch 2534 may be considered to form, or be a part of, an RF FE of the RF device 2500. In some embodiments, the RX path amplifier 2512, the TX path amplifier 2522, the duplexer 2504, and the RF switch 2534 may be considered to form, or be a part of, an RF FE of the RF device 2500. In some embodiments, the RX path mixer 2516 and the TX path mixer 2526 (possibly with their associated pre-mix and post-mix filters shown in FIG. 9)

may be considered to form, or be a part of, an RF transceiver of the RF device 2500 (or of an RF receiver or an RF transmitter if only RX path or TX path components, respectively, are included in the RF device 2500). In some embodiments, the RF device 2500 may further include one or more control logic elements/circuits, shown in FIG. 9 as control logic 2536, e.g., an RF FE control interface. The control logic 2536 may be used to, e.g., enhance control of complex RF system environment, support implementation of envelope tracking techniques, reduce dissipated power, etc. Various IC structures as described herein may be particularly advantageous for realizing at least portions of such control logic elements/circuits.

The antenna 2502 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2500 is an FDD transceiver, the antenna 2502 may be configured for concurrent reception and transmission of communication signals in separate, i.e., non-overlapping and non-continuous, bands of frequencies, e.g., in bands having a separation of, e.g., 20 MHz from one another. If the RF device 2500 is a TDD transceiver, the antenna 2502 may be configured for sequential reception and transmission of communication signals in bands of frequencies that may be the same, or overlapping for TX and RX paths. In some embodiments, the RF device 2500 may be a multi-band RF device, in which case the antenna 2502 may be configured for concurrent reception of signals having multiple RF components in separate frequency bands and/or configured for concurrent transmission of signals having multiple RF components in separate frequency bands. In such embodiments, the antenna 2502 may be a single wide-band antenna or a plurality of band-specific antennas (i.e., a plurality of antennas each configured to receive and/or transmit signals in a specific band of frequencies). In various embodiments, the antenna 2502 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2500 may include more than one antenna 2502 to implement antenna diversity. In some such embodiments, the RF switch 2534 may be deployed to switch between different antennas. Any of the embodiments of the IC structures with at least one transistor arrangement with one or more charge-induced threshold voltage tuning elements may be used to implement at least a portion of the RF switch 2534.

An output of the antenna 2502 may be coupled to the input of the duplexer 2504. The duplexer 2504 may be any suitable component configured for filtering multiple signals to allow for bidirectional communication over a single path between the duplexer 2504 and the antenna 2502. The duplexer 2504 may be configured for providing RX signals to the RX path of the RF device 2500 and for receiving TX signals from the TX path of the RF device 2500.

The RF device 2500 may include one or more local oscillators 2506, configured to provide local oscillator signals that may be used for downconversion of the RF signals received by the antenna 2502 and/or upconversion of the signals to be transmitted by the antenna 2502.

The RF device 2500 may include the digital processing unit 2508, which may include one or more processing devices. In some embodiments, the digital processing unit 2508 may be implemented as the processing device 2402 shown in FIG. 8, descriptions of which are provided above (when used as the digital processing unit 2508, the processing device 2402 may, but does not have to, implement any of the IC structures as described herein, e.g., IC structures having at least one transistor arrangement with one or more charge-induced threshold voltage tuning elements in accordance with any of the embodiments disclosed herein). The digital processing unit 2508 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 9, in some embodiments, the RF device 2500 may further include a memory device, e.g., the memory device 2404 as described with reference to FIG. 8, configured to cooperate with the digital processing unit 2508. When used within, or coupled to, the RF device 2500, the memory device 2404 may, but does not have to, implement any of the IC structures as described herein, e.g., IC structures having at least one transistor arrangement with one or more charge-induced threshold voltage tuning elements in accordance with any of the embodiments disclosed herein.

Turning to the details of the RX path that may be included in the RF device 2500, the RX path amplifier 2512 may include an LNA. An input of the RX path amplifier 2512 may be coupled to an antenna port (not shown) of the antenna 2502, e.g., via the duplexer 2504. The RX path amplifier 2512 may amplify the RF signals received by the antenna 2502.

An output of the RX path amplifier 2512 may be coupled to an input of the RX path pre-mix filter 2514, which may be a harmonic or band-pass (e.g., low-pass) filter, configured to filter received RF signals that have been amplified by the RX path amplifier 2512.

An output of the RX path pre-mix filter 2514 may be coupled to an input of the RX path mixer 2516, also referred to as a downconverter. The RX path mixer 2516 may include two inputs and one output. A first input may be configured to receive the RX signals, which may be current signals, indicative of the signals received by the antenna 2502 (e.g., the first input may receive the output of the RX path pre-mix filter 2514). A second input may be configured to receive local oscillator signals from one of the local oscillators 2506. The RX path mixer 2516 may then mix the signals received at its two inputs to generate a downconverted RX signal, provided at an output of the RX path mixer 2516. As used herein, downconversion refers to a process of mixing a received RF signal with a local oscillator signal to generate a signal of a lower frequency. In particular, the TX path mixer (e.g., downconverter) 2516 may be configured to generate the sum and/or the difference frequency at the output port when two input frequencies are provided at the two input ports. In some embodiments, the RF device 2500 may implement a direct-conversion receiver (DCR), also known as homodyne, synchrodyne, or zero-IF receiver, in which case the RX path mixer 2516 may be configured to demodulate the incoming radio signals using local oscillator signals whose frequency is identical to, or very close to the carrier frequency of the radio signal. In other embodiments, the RF device 2500 may make use of downconversion to an intermediate frequency (IF). IFs may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2516 may include several such stages of IF conversion.

Although a single RX path mixer 2516 is shown in the RX path of FIG. 9, in some embodiments, the RX path mixer 2516 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2502 and an in-phase component of the local oscillator signal provided by the local oscillator 2506. The second RX path mixer may be configured for performing downconversion to generate a quadrature (Q) downconverted RX signal by mixing the RX signal received by the antenna 2502 and a quadrature component of the local oscillator signal provided by the local oscillator 2506 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2516 may, optionally, be coupled to the RX path post-mix filter 2518, which may be low-pass filters. In case the RX path mixer 2516 is a quadrature mixer that implements the first and second mixers as described above, the in-phase and quadrature components provided at the outputs of the first and second mixers respectively may be coupled to respective individual first and second RX path post-mix filters included in the filter 2518.

The ADC 2520 may be configured to convert the mixed RX signals from the RX path mixer 2516 from analog to digital domain. The ADC 2520 may be a quadrature ADC that, similar to the RX path quadrature mixer 2516, may include two ADCs, configured to digitize the downconverted RX path signals separated in in-phase and quadrature components. The output of the ADC 2520 may be provided to the digital processing unit 2508, configured to perform various functions related to digital processing of the RX signals so that information encoded in the RX signals can be extracted.

Turning to the details of the TX path that may be included in the RF device 2500, the digital signal to later be transmitted (TX signal) by the antenna 2502 may be provided, from the digital processing unit 2508, to the DAC 2530. Similar to the ADC 2520, the DAC 2530 may include two DACs, configured to convert, respectively, digital I- and Q-path TX signal components to analog form.

Optionally, the output of the DAC 2530 may be coupled to the TX path pre-mix filter 2528, which may be a bandpass (e.g., low-pass) filter (or a pair of band-pass, e.g., low-pass, filters, in case of quadrature processing) configured to filter out, from the analog TX signals output by the DAC 2530, the signal components outside of the desired band. The digital TX signals may then be provided to the TX path mixer 2526, which may also be referred to as an upconverter. Similar to the RX path mixer 2516, the TX path mixer 2526 may include a pair of TX path mixers, for in-phase and quadrature component mixing. Similar to the first and second RX path mixers that may be included in the RX path, each of the TX path mixers of the TX path mixer 2526 may include two inputs and one output. A first input may receive the TX signal components, converted to the analog form by the respective DAC 2530, which are to be upconverted to generate RF signals to be transmitted. The first TX path mixer may generate an in-phase (I) upconverted signal by mixing the TX signal component converted to analog form by the DAC 2530 with the in-phase component of the TX path local oscillator signal provided from the local oscillator 2506 (in various embodiments, the local oscillator 2506 may include a plurality of different local oscillators, or be configured to provide different local oscillator frequencies for the mixer 2516 in the RX path and the mixer 2526 in the TX path). The second TX path mixer may generate a quadrature phase (Q) upconverted signal by mixing the TX signal component converted to analog form by the DAC 2530 with the quadrature component of the TX path local oscillator signal. The output of the second TX path mixer may be added to the output of the first TX path mixer to create a real RF signal. A second input of each of the TX path mixers may be coupled the local oscillator 2506.

Optionally, the RF device 2500 may include the TX path post-mix filter 2524, configured to filter the output of the TX path mixer 2526.

The TX path amplifier 2522 may be a PA, configured to amplify the upconverted RF signal before providing it to the antenna 2502 for transmission. Any of the embodiments of the IC structures with at least one transistor arrangement with one or more charge-induced threshold voltage tuning elements may be used to implement the TX path amplifier 2522 as a PA.

In various embodiments, any of the RX path pre-mix filter 2514, the RX path post-mix filter 2518, the TX post-mix filter 2524, and the TX pre-mix filter 2528 may be implemented as RF filters. In some embodiments, each of such RF filters may include one or more, typically a plurality of, resonators (e.g., film bulk acoustic resonators (FBARs), Lamb wave resonators, and/or contour-wave resonators), arranged, e.g., in a ladder configuration. An individual resonator of an RF filter may include a layer of a piezoelectric material such as AlN, enclosed between a bottom electrode and a top electrode, with a cavity provided around a portion of each electrode in order to allow a portion of the piezoelectric material to vibrate during operation of the filter. In some embodiments, an RF filter may be implemented as a plurality of RF filters, or a filter bank. A filter bank may include a plurality of RF resonators that may be coupled to a switch, e. g., the RF switch 2534, configured to selectively switch any one of the plurality of RF resonators on and off (i.e., activate any one of the plurality of RF resonators), in order to achieve desired filtering characteristics of the filter bank (i.e., in order to program the filter bank). For example, such a filter bank may be used to switch between different RF frequency ranges when the RF device 2500 is, or is included in, a BS or in a UE device. In another example, such a filter bank may be programmable to suppress TX leakage on the different duplex distances.

The impedance tuner 2532 may include any suitable circuitry, configured to match the input and output impedances of the different RF circuitries to minimize signal losses in the RF device 2500. For example, the impedance tuner 2532 may include an antenna impedance tuner. Being able to tune the impedance of the antenna 2502 may be particularly advantageous because antenna's impedance is a function of the environment that the RF device 2500 is in, e.g., antenna's impedance changes depending on, e.g., if the antenna is held in a hand, placed on a car roof, etc.

As described above, the RF switch 2534 may be a device configured to route high-frequency signals through transmission paths, e.g., in order to selectively switch between a plurality of instances of any one of the components shown in FIG. 9, e.g., to achieve desired behavior and characteristics of the RF device 2500. For example, in some embodiments, an RF switch may be used to switch between different antennas 2502. In other embodiments, an RF switch may be used to switch between a plurality of RF resonators (e.g., by selectively switching RF resonators on and off) of any of the filters included in the RF device 2500. In some embodiments, the RF switch 2534 may be implemented as a solid-state RF switch in the form of any embodiments of a transistor, e.g., a III-N transistor, with one or more charge-induced threshold voltage tuning elements as described herein. Typically, an RF system, or an RFIC, would include a plurality of such RF switches.

In various embodiments, transistor arrangements with one or more charge-induced threshold voltage tuning elements as described herein may be particularly advantageous when used in, or to provide an RF interconnect to (i.e., to provide means for supporting communication of RF signals to), any of the duplexer 2504, RX path amplifier 2512, RX path pre-mix filter 2514, RX path post-mix filter 2518, TX path amplifier 2522, TX path pre-mix filter 2528, TX path post-mix filter 2524, impedance tuner 2532, and/or RF switch 2534. In various embodiments, transistor arrangements with one or more charge-induced threshold voltage tuning elements as described herein may enable more energy efficient CMOS implementations of circuits, e.g., to name a few, control logic circuitries, current mirrors, power gating circuitries, memory elements etc.

The RF device 2500 provides a simplified version and, in further embodiments, other components not specifically shown in FIG. 9 may be included. For example, the RX path of the RF device 2500 may include a current-to-voltage amplifier between the RX path mixer 2516 and the ADC 2520, which may be configured to amplify and convert the downconverted signals to voltage signals. In another example, the RX path of the RF device 2500 may include a balun transformer for generating balanced signals. In yet another example, the RF device 2500 may further include a clock generator, which may, e.g., include a suitable phased-lock loop (PLL), configured to receive a reference clock signal and use it to generate a different clock signal that may then be used for timing the operation of the ADC 2520, the DAC 2530, and/or that may also be used by the local oscillator 2506 to generate the local oscillator signals to be used in the RX path or the TX path.

SELECT EXAMPLES

The following paragraphs provide various examples of the embodiments disclosed herein.

Example 1 provides an IC structure that includes a support structure (e.g., a substrate, a die, or a chip), and a transistor that includes a gate stack. The transistor may be a III-N transistor that includes a III-N semiconductor material and a polarization material, the III-N semiconductor material and the polarization material forming a III-N channel stack of the III-N transistor, where a lattice constant of the polarization material is smaller than a lattice constant of the III-N semiconductor material (e.g., at least 3% smaller, or at least 5% smaller, e.g., between about 5 and 10% smaller). Thus, tensile strain may be induced in the polarization material, which may contribute to formation of 2DEG in a portion of the III-N semiconductor material adjacent the polarization material. The gate stack includes a gate electrode material and a doped semiconductor material between the gate electrode material and the III-N semiconductor material, the doped semiconductor material including dopant atoms in concentration of at least $1 \times 10^{18}$ cm$^{-3}$, e.g., of at least $1 \times 10^{19}$ cm$^{-3}$ or of at least $1 \times 10^{20}$ cm$^{-3}$.

Example 2 provides the IC structure according to example 1, where the dopant atoms are N-type dopant atoms.

Example 3 provides the IC structure according to example 1, where the dopant atoms are P-type dopant atoms.

Example 4 provides the IC structure according to any one of the preceding examples, where the doped semiconductor material has a thickness between about 1 nanometer and 50 nanometers, including all values and ranges therein, e.g., between about 1 and 15 nanometers, or between about 1 and 5 nanometers.

Example 5 provides the IC structure according to any one of the preceding examples, where the doped semiconductor material includes doped silicon, e.g., doped polysilicon.

Example 6 provides the IC structure according to any one of examples 1-5, where the polarization material is between the III-N semiconductor material and the gate electrode material.

Example 7 provides the IC structure according to example 6, where the gate stack further includes a gate dielectric material, and the doped semiconductor material is between the gate electrode material and the gate dielectric material.

Example 8 provides the IC structure according to example 6, where the gate dielectric materials is not used and the doped semiconductor material interfaces (i.e., is in contact with, possibly resulting in a formation of an interfacial layer) the polarization material.

Example 9 provides the IC structure according to any one of examples 1-5, where the III-N semiconductor material is between the polarization material and the gate electrode material.

Example 10 provides the IC structure according to example 9, where the gate stack further includes a gate dielectric material, and the doped semiconductor material is between the gate electrode material and the gate dielectric material.

In other embodiments, the gate stack could form a Schottky contact with the III-N channel stack (i.e., the gate dielectric materials is not used) and the doped semiconductor material could interface (i.e., be in contact with) the III-N semiconductor material.

Example 11 provides an IC structure that includes a support structure (e.g., a substrate, a die, or a chip), and a transistor that includes a gate stack. The transistor may be a III-N transistor that includes a III-N semiconductor material and a polarization material, the III-N semiconductor material and the polarization material forming a III-N channel stack of the III-N transistor, where a lattice constant of the polarization material is smaller than a lattice constant of the III-N semiconductor material (e.g., at least 3% smaller, or at least 5% smaller, e.g., between about 5 and 10% smaller). Thus, tensile strain may be induced in the polarization material, which may contribute to formation of 2DEG in a portion of the III-N semiconductor material adjacent the polarization material. The gate stack includes a gate electrode material and a fixed charge material between the gate electrode material and the III-N semiconductor material, the fixed charge material including fixed charges in concentration of at least $1 \times 10^{18}$ cm$^{-3}$, e.g., of at least $1 \times 10^{20}$ cm$^{-3}$ or of at least $1 \times 10^{21}$ cm$^{-3}$.

Example 12 provides the IC structure according to example 11, where the fixed charges are positive fixed charges.

Example 13 provides the IC structure according to example 11, where the fixed charges are negative fixed charges.

Example 14 provides the IC structure according to any one of examples 11-13, where the fixed charge material has a thickness between about 1 nanometer and 10 nanometers, including all values and ranges therein, e.g., between about 1 and 5 nanometers, or between about 1 and 3 nanometers.

Example 15 provides the IC structure according to any one of examples 11-14, where the fixed charge material includes lanthanum and oxygen (e.g., includes lanthanum oxide).

Example 16 provides the IC structure according to any one of examples 11-15, where the polarization material is between the III-N semiconductor material and the gate electrode material.

Example 17 provides the IC structure according to example 16, where the gate stack further includes a gate dielectric material, and the fixed charge material is between the gate electrode material and the gate dielectric material.

Example 18 provides the IC structure according to example 16, where the fixed charge material interfaces the polarization material.

Example 19 provides the IC structure according to any one of examples 11-15, where the MI-N semiconductor material is between the polarization material and the gate electrode material.

Example 20 provides the IC structure according to example 19, where the gate stack further includes a gate dielectric material, and the fixed charge material is between the gate electrode material and the gate dielectric material.

In other embodiments, the gate stack could form a Schottky contact with the III-N channel stack (i.e., the gate dielectric materials is not used) and the fixed charge material could interface (i.e., be in contact with) the III-N semiconductor material.

Example 21 provides an IC structure that includes a support structure (e.g., a substrate, a die, or a chip), and a transistor that includes a gate stack. The transistor may be a III-N transistor that includes a III-N semiconductor material and a polarization material, the III-N semiconductor material and the polarization material forming a III-N channel stack of the III-N transistor, where a lattice constant of the polarization material is smaller than a lattice constant of the III-N semiconductor material (e.g., at least 3% smaller, or at least 5% smaller, e.g., between about 5 and 10% smaller). Thus, tensile strain may be induced in the polarization material, which may contribute to formation of 2DEG in a portion of the III-N semiconductor material adjacent the polarization material. The IC structure further includes a doped semiconductor material between the gate stack and the channel stack, the doped semiconductor material including dopant atoms in concentration of at least $1\times10^{18}$ cm$^{-3}$, e.g., of at least $1\times10^{19}$ cm$^{-3}$ or of at least $1\times10^{20}$ cm$^{-3}$.

Example 22 provides the IC structure according to example 21, where the dopant atoms are N-type dopant atoms.

Example 23 provides the IC structure according to example 21, where the dopant atoms are P-type dopant atoms.

Example 24 provides the IC structure according to any one of examples 21-23, where the doped semiconductor material has a thickness between about 1 nanometer and 50 nanometers, including all values and ranges therein, e.g., between about 1 and 15 nanometers, or between about 1 and 5 nanometers.

Example 25 provides the IC structure according to any one of examples 21-24, where the doped semiconductor material includes gallium and nitrogen, e.g., doped GaN or doped AlInGaN.

Example 26 provides the IC structure according to any one of examples 21-25, where the polarization material is between the III-N semiconductor material and the doped semiconductor material.

Example 27 provides the IC structure according to example 26, where the gate stack includes a gate electrode material and a gate dielectric material, the doped semiconductor material is between the polarization material and the gate dielectric material, and the gate dielectric material is between the doped semiconductor material and the gate electrode material.

Example 28 provides the IC structure according to example 26, where the gate stack includes a gate electrode material, and the doped semiconductor material interfaces (i.e., is in contact with, possibly resulting in a formation of an interfacial layer) the gate electrode material.

Example 29 provides the IC structure according to any one of examples 21-25, where the III-N semiconductor material is between the polarization material and the doped semiconductor material.

Example 30 provides the IC structure according to example 29, where the gate stack includes a gate electrode material and a gate dielectric material, and the doped semiconductor material is between the III-N semiconductor material and the gate dielectric material.

In other embodiments, the doped semiconductor material could interface (i.e., be in contact with) the gate electrode material.

Example 31 provides an IC package that includes an IC die, the IC die including the IC structure according to any one of the preceding examples (e.g., any one of examples 1-30), and a further IC component, coupled to the IC die.

In some further examples of the IC package according to example 31, the further IC component includes one of a package substrate, an interposer, or a further IC die.

In some further examples of the IC package according to example 31, the IC package is included in a base station of a wireless communication system.

In some further examples of the IC package according to example 31, the IC package is included in a UE device (e.g., a mobile device) of a wireless communication system.

In some further examples of the IC package according to example 31, the IC die is a part of an RF device.

Example 32 provides an electronic device that includes a carrier substrate and an IC die coupled to the carrier substrate. The IC die includes the IC structure according to any one of examples 1-30, and/or is included in the IC package according to any one of the preceding examples.

Example 33 provides the electronic device according to example 32, where the computing device is a wearable or handheld electronic device.

Example 34 provides the electronic device according to examples 32 or 33, where the electronic device further includes one or more communication chips and an antenna.

Example 35 provides the electronic device according to any one of examples 32-34, where the carrier substrate is a motherboard.

Example 36 provides the electronic device according to any one of examples 32-35, where the electronic device is an RF transceiver.

Example 37 provides the electronic device according to any one of examples 32-36, where the electronic device is one of an RF switch, a power amplifier, a low-noise amplifier, a filter, a filter bank, a duplexer, an upconverter, or a downconverter of an RF communications device, e.g., of an RF transceiver.

Example 38 provides the electronic device according to any one of examples 32-37, where the electronic device is included in a base station of a wireless communication system.

Example 39 provides the electronic device according to any one of examples 32-37, where the electronic device is included in a UE device (e.g., a mobile device) of a wireless communication system.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) structure, comprising:
a transistor that includes:
 a III-N semiconductor material,
 a gate electrode material, and
 a further material between the gate electrode material and the III-N semiconductor material, the further material including a semiconductor material with dopant atoms in concentration of at least $1 \times 10^{18}$ dopant atoms per cubic centimeter, wherein the further material includes doped silicon.

2. The IC structure according to claim 1, wherein the further material has a thickness between 1 nanometer and 50 nanometers.

3. The IC structure according to claim 1, wherein:
the transistor further includes a gate dielectric material, and
the further material is between the gate electrode material and the gate dielectric material.

4. The IC structure according to claim 1, wherein:
the transistor further includes a polarization material, where a lattice constant of the polarization material is smaller than a lattice constant of the III-N semiconductor material, and
the further material is in contact with the polarization material.

5. The IC structure according to claim 1, wherein:
the transistor further includes a polarization material, and
the III-N semiconductor material is between the polarization material and the gate electrode material.

6. The IC structure according to claim 5, wherein:
the transistor further includes a gate dielectric material, and
the further material is between the gate electrode material and the gate dielectric material.

7. The IC structure according to claim 5, wherein a lattice constant of the polarization material is smaller than a lattice constant of the III-N semiconductor material.

8. The IC structure according to claim 1, wherein the further material has a U-shaped cross-section.

9. An integrated circuit (IC) structure, comprising:
a substrate; and
a transistor, comprising:
 a III-N semiconductor material,
 a polarization material, where a lattice constant of the polarization material is smaller than a lattice constant of the III-N semiconductor material,
 a gate electrode material, and
 a further material between the gate electrode material and the III-N semiconductor material, wherein the further material includes fixed charges in concentration of at least $1 \times 10^{18}$ fixed charges per cubic centimeter, and wherein the further material includes oxygen.

10. The IC structure according to claim 9, wherein the further material further includes lanthanum.

11. The IC structure according to claim 9, wherein:
the transistor further includes a gate dielectric material, and
the further material is between the gate electrode material and the gate dielectric material.

12. The IC structure according to claim 9, wherein the further material interfaces the polarization material.

13. The IC structure according to claim 9, wherein:
the III-N semiconductor material is between the polarization material and the gate electrode material;
the transistor further includes a gate dielectric material, and
the further material is between the gate electrode material and the gate dielectric material.

14. The IC structure according to claim 9, wherein, in a cross-section along a plane perpendicular to the substrate, the further material has a U-shape.

15. An integrated circuit (IC) structure, comprising:
a transistor that includes:
 a gate electrode material;
 a polarization material;
 a III-N semiconductor material between the polarization material and the gate electrode material, wherein a lattice constant of the polarization material is smaller than a lattice constant of the III-N semiconductor material; and
 a further material between the gate electrode material and the III-N semiconductor material, the further material including a semiconductor material with dopant atoms in concentration of at least $1 \times 10^{18}$ dopant atoms per cubic centimeter.

16. The IC structure according to claim 15, wherein the further material includes gallium and nitrogen.

17. The IC structure according to claim 15, wherein:
the transistor further includes a gate dielectric material, and
the further material is between the gate electrode material and the gate dielectric material.

18. The IC structure according to claim 15, wherein the further material includes silicon.

19. The IC structure according to claim 15, wherein the further material includes magnesium.

* * * * *